US010412319B2

(12) United States Patent
Narumi et al.

(10) Patent No.: US 10,412,319 B2
(45) Date of Patent: Sep. 10, 2019

(54) IMAGING APPARATUS INCLUDING IMAGE SENSOR, OPTICAL SYSTEM, CONTROL CIRCUIT, AND SIGNAL PROCESSING CIRCUIT

(71) Applicant: Panasonic Intellectual Property Management Co., Ltd., Osaka (JP)

(72) Inventors: Kenji Narumi, Osaka (JP); Seiji Nishiwaki, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 31 days.

(21) Appl. No.: 15/806,050

(22) Filed: Nov. 7, 2017

(65) Prior Publication Data

US 2018/0167563 A1 Jun. 14, 2018

(30) Foreign Application Priority Data

Dec. 8, 2016 (JP) ................. 2016-238792

(51) Int. Cl.
*G01J 9/00* (2006.01)
*G01J 9/02* (2006.01)
(Continued)

(52) U.S. Cl.
CPC ............. *H04N 5/265* (2013.01); *G01J 9/00* (2013.01); *G03B 5/06* (2013.01); *G03B 5/08* (2013.01);
(Continued)

(58) Field of Classification Search
CPC ... G03B 11/04; G03B 5/08; G03B 5/06; G01J 9/00; G01J 2009/0284; G01J 9/02;
(Continued)

(56) References Cited

U.S. PATENT DOCUMENTS

2003/0044729 A1* 3/2003 Huang ................. G02B 5/1814
430/321
2003/0063204 A1 4/2003 Suda
(Continued)

FOREIGN PATENT DOCUMENTS

JP 2003-078917 3/2003
JP 2010-286828 12/2010
(Continued)

OTHER PUBLICATIONS

Max Born et al., "Principles of Optics", Tokai University Press, Dec. 20, 1980, pp. 478-485 (Partial Translation).
(Continued)

*Primary Examiner* — Timothy J Henn
(74) *Attorney, Agent, or Firm* — McDermott Will & Emery LLP

(57) ABSTRACT

An imaging apparatus includes an image sensor, an optical system, a control circuit, and a signal processing circuit. The image sensor includes a light-shielding film in which light-transmitting regions and light-shielding regions are alternately arranged in at least a first direction within a plane, a photodetector disposed opposite the light-shielding film, and an optically-coupled layer disposed between the light-shielding film and the photodetector. The optically-coupled layer includes a grating which generates a propagating light that propagates in the first direction and a transmitting light that transmits the optically-coupled layer when light of a predetermined wavelength enters the light-transmitting regions. The signal processing circuit extracts two different frames from frames included in a moving image acquired by the image sensor.

7 Claims, 25 Drawing Sheets

(51) Int. Cl.
G03B 5/06 (2006.01)
G03B 5/08 (2006.01)
G06K 9/46 (2006.01)
G03B 11/04 (2006.01)
H04N 5/225 (2006.01)
H04N 5/232 (2006.01)
H04N 5/265 (2006.01)
H01L 27/146 (2006.01)

(52) U.S. Cl.
CPC .............. *G03B 11/04* (2013.01); *G06K 9/46* (2013.01); *H01L 27/1462* (2013.01); *H01L 27/14623* (2013.01); *H01L 27/14625* (2013.01); *H01L 27/14627* (2013.01); *H01L 27/14629* (2013.01); *H04N 5/2256* (2013.01); *H04N 5/232* (2013.01); *G01J 9/02* (2013.01); *G01J 2009/0284* (2013.01)

(58) Field of Classification Search
CPC ........ G06K 9/46; H04N 5/265; H04N 5/2256; H04N 5/232; H01L 27/14623; H01L 27/1462; H01L 27/14625; H01L 27/14629; H01L 27/14627
See application file for complete search history.

(56) References Cited

U.S. PATENT DOCUMENTS

| | | | | |
|---|---|---|---|---|
| 2010/0118172 | A1* | 5/2010 | McCarten | H01L 27/14621 348/302 |
| 2011/0267487 | A1* | 11/2011 | Yamagata | H01L 27/14627 348/222.1 |
| 2012/0105843 | A1 | 5/2012 | Hirai et al. | |
| 2012/0120383 | A1 | 5/2012 | Ogino | |
| 2013/0093034 | A1* | 4/2013 | Kokubun | H01L 27/14621 257/432 |
| 2013/0113964 | A1* | 5/2013 | Sasaki | H01L 27/14629 348/276 |
| 2013/0202081 | A1* | 8/2013 | Rossl | A61B 6/484 378/36 |
| 2014/0270061 | A1* | 9/2014 | Yamaguchi | G02B 5/1842 378/36 |
| 2016/0073043 | A1* | 3/2016 | Stork | A61B 3/113 348/164 |
| 2016/0360967 | A1* | 12/2016 | Nishiwaki | G02B 6/34 |
| 2017/0284863 | A1* | 10/2017 | Nishiwaki | G01B 9/02041 |
| 2018/0130914 | A1* | 5/2018 | Kautzsch | H01L 27/14618 |
| 2018/0164159 | A1* | 6/2018 | Nishiwaki | G01B 9/02 |
| 2018/0164160 | A1* | 6/2018 | Nishiwaki | A61B 5/1455 |

FOREIGN PATENT DOCUMENTS

| | | |
|---|---|---|
| JP | 2012-095124 | 5/2012 |
| JP | 2012-248032 | 12/2012 |
| JP | 2013-034095 | 2/2013 |

OTHER PUBLICATIONS

Goro Nishimura, "Prospects for Near-Infrared Spectroscopy—Possibilities of 1-μm Wavelength Region", The 14th Meeting of Japanese Society for Medical Near Infrared Spectroscopy, vol. 49, Jul. 24, 2009, pp. 139-145 (Whole sentence Translation).

* cited by examiner

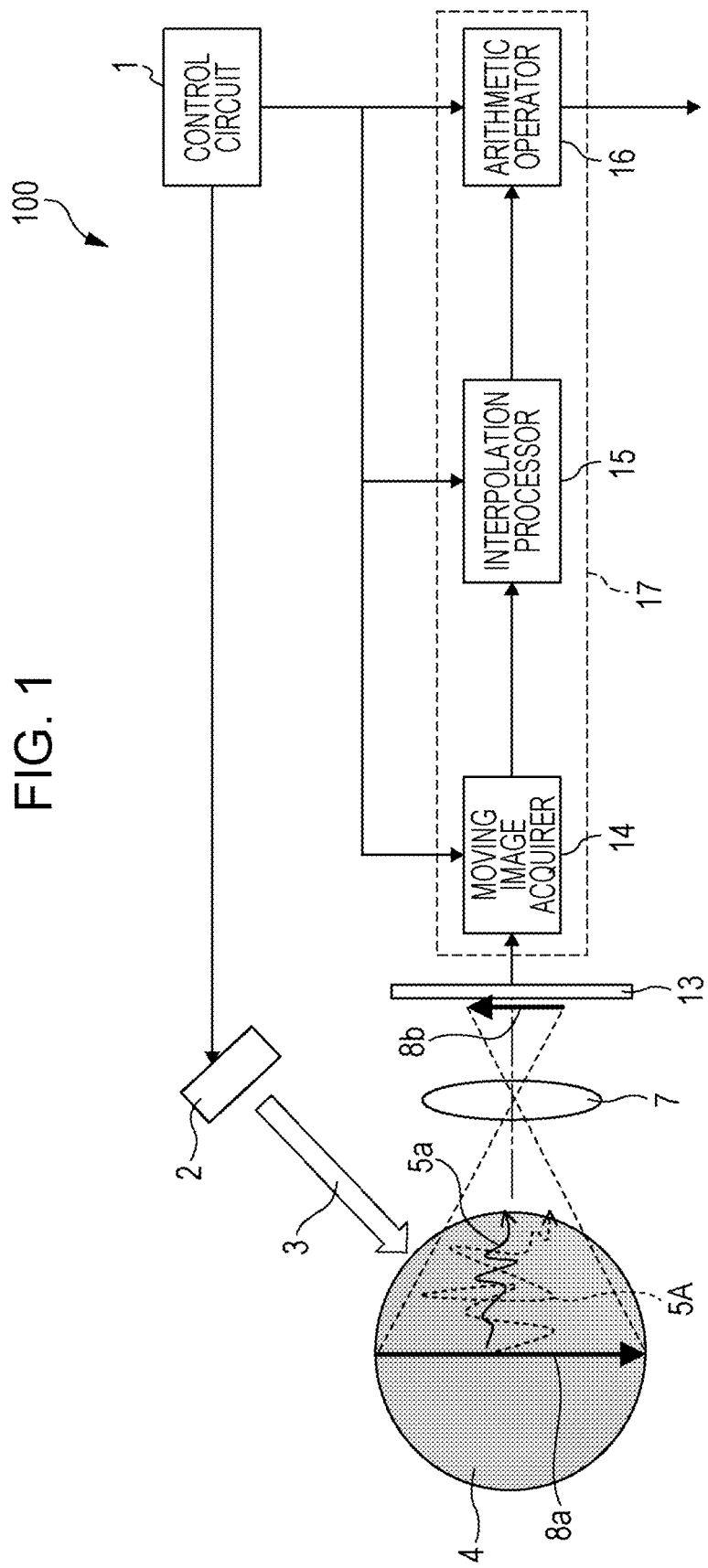

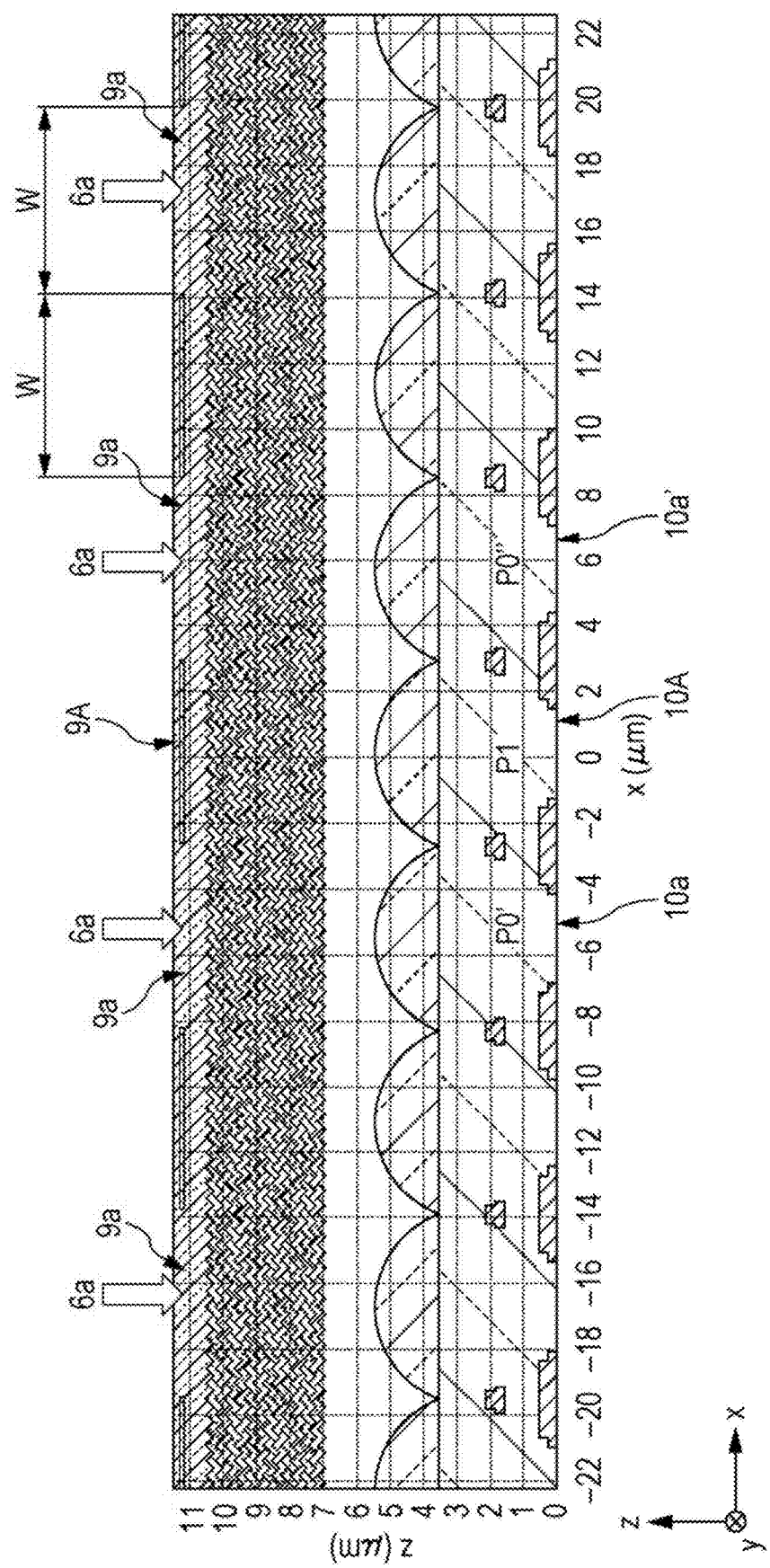

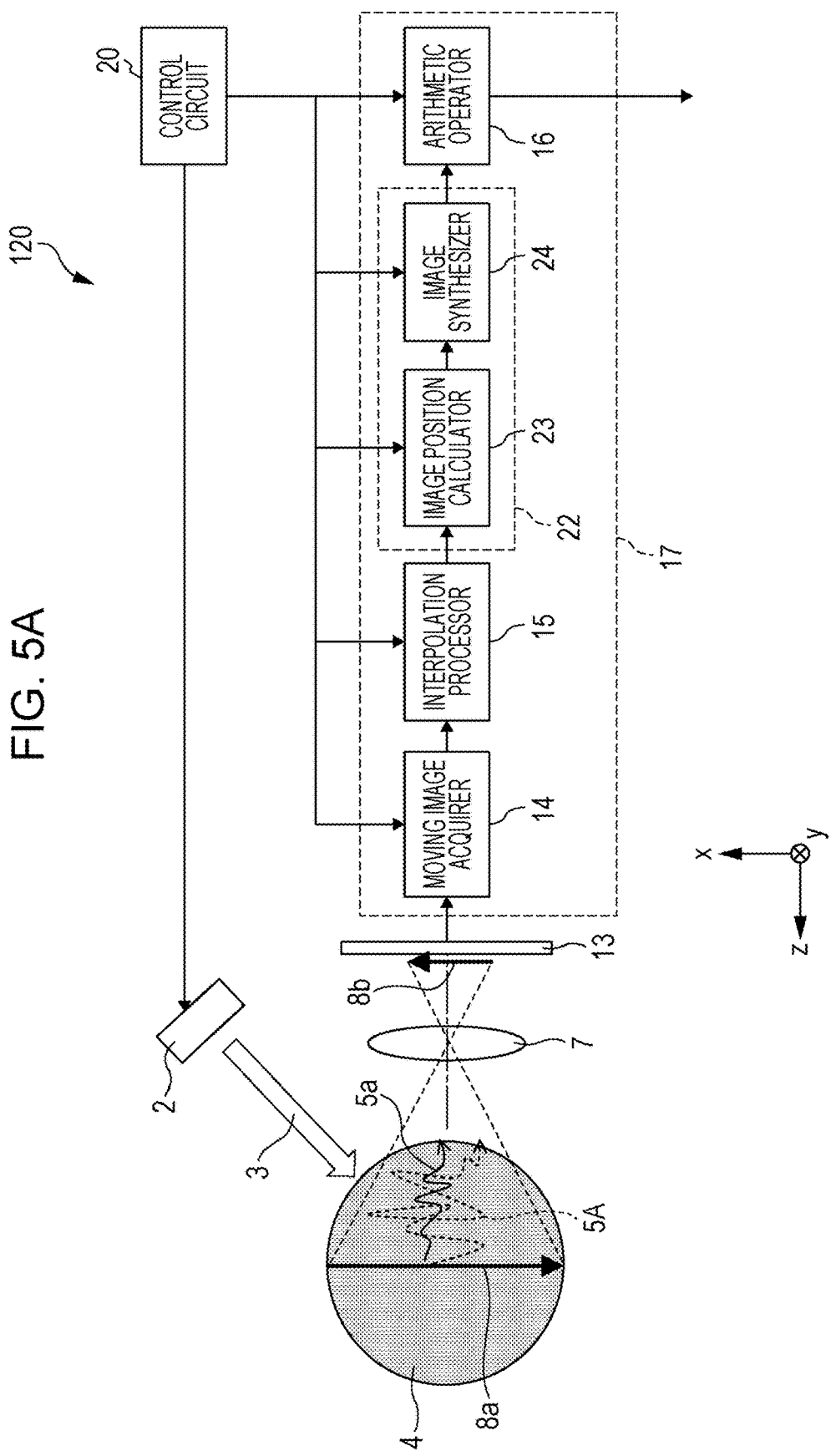

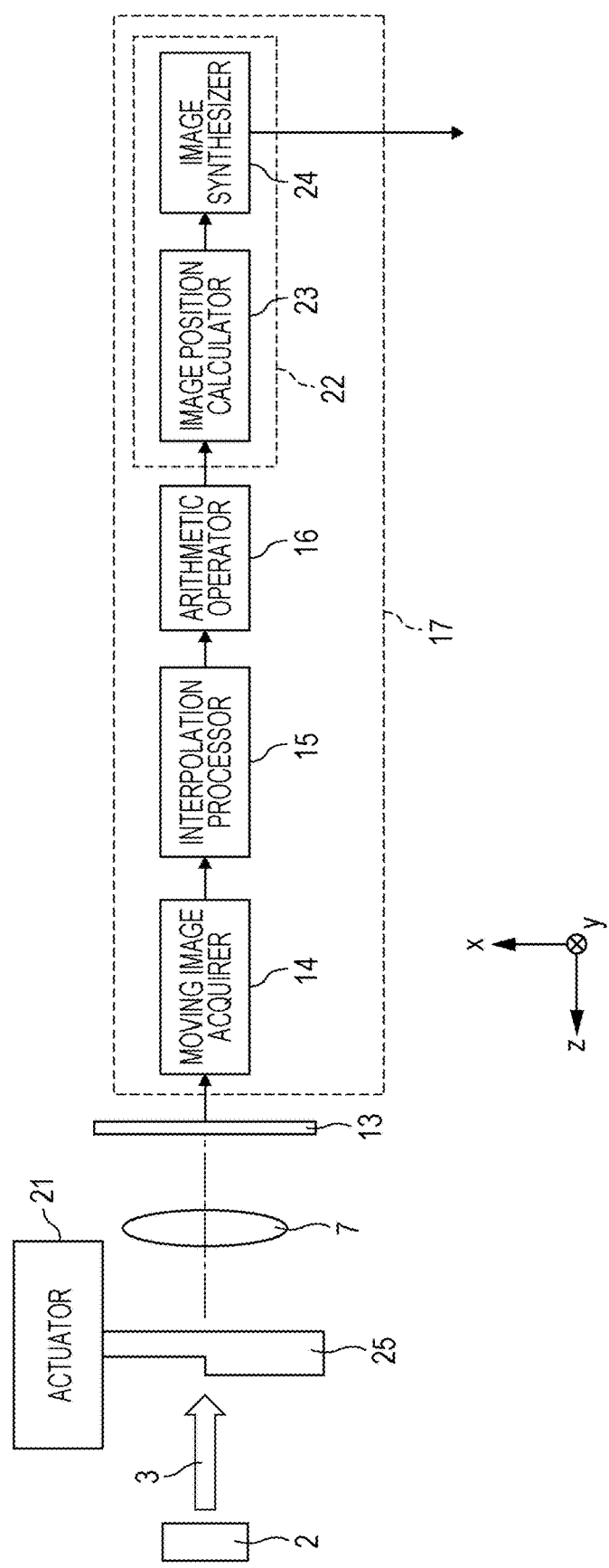

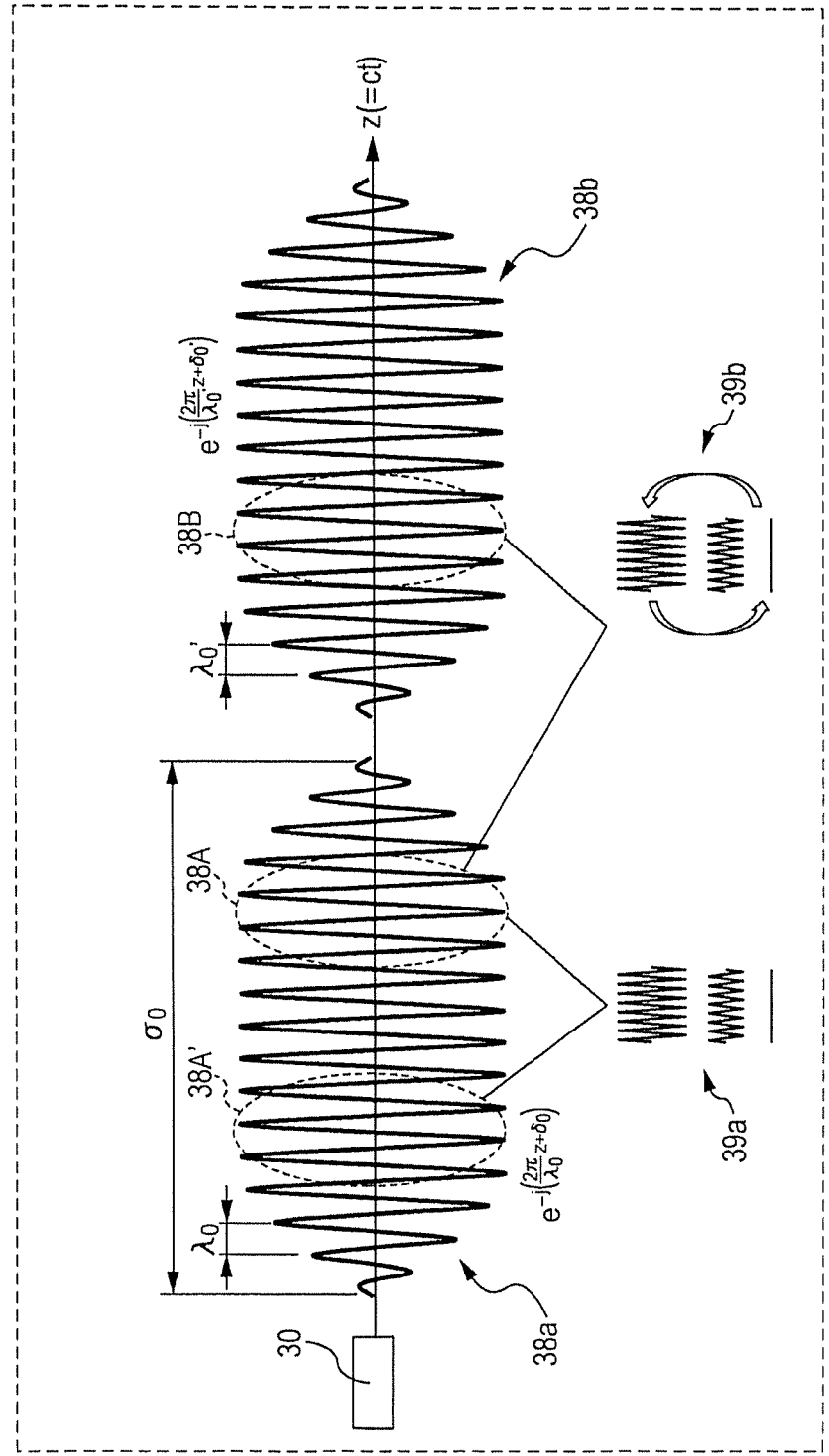

PRIOR ART   FIG. 14A
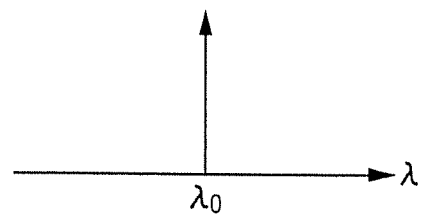
PRIOR ART   FIG. 14B
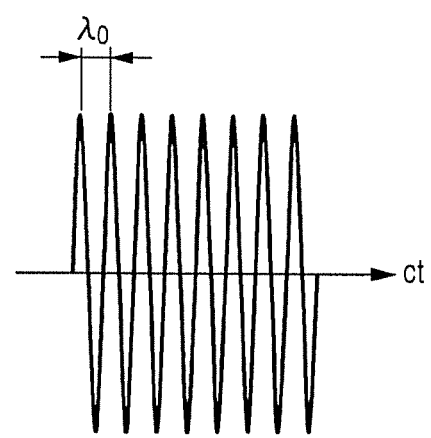
PRIOR ART   FIG. 14C
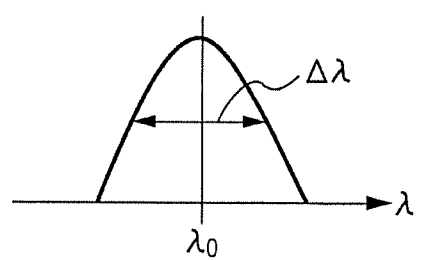

IMAGING APPARATUS INCLUDING IMAGE SENSOR, OPTICAL SYSTEM, CONTROL CIRCUIT, AND SIGNAL PROCESSING CIRCUIT

BACKGROUND

1. Technical Field

The present disclosure relates to an imaging apparatus that acquires information associated with the optical characteristics of an object by utilizing an interference phenomenon of light.

2. Description of the Related Art

Light is electromagnetic radiation that is characterized by characteristics such as polarization and coherence as well as wavelength and intensity. An example of a method for measuring an object by utilizing the coherence, among other characteristics, of light is a method disclosed in *Principles of Optics* (Tokai University Press, p. 482, M. Born et al) that involves the use of a Michelson's interferometer.

SUMMARY

In one general aspect, the techniques disclosed here feature an imaging apparatus including: an image sensor for acquiring a moving image of an object, an optical system, a control circuit, and a signal processing circuit. The image sensor includes a light-shielding film, a photodetector disposed opposite the light-shielding film, and an optically-coupled layer disposed between the light-shielding film and the photodetector. The light-shielding film includes light-transmitting regions and light-shielding regions. The light-transmitting regions and the light-shielding regions are alternately arranged in at least a first direction within a plane. The photodetector has an imaging area and includes first pixels and second pixels. The first pixels and the second pixels are two-dimensionally arranged on the imaging area. Each of the first pixels faces one of the light-transmitting regions and each of the second pixels faces one of the light-shielding regions. The optically-coupled layer includes a grating which generates a propagating light that propagates in the first direction and a transmitting light that transmits the optically-coupled layer when light of a predetermined wavelength enters the light-transmitting regions. The optical system forms an image of the object on the imaging area. The control circuit causes the image sensor to acquire the moving image. The signal processing circuit extracts two different frames from among frames included in the moving image acquired by the image sensor.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a diagram schematically showing an imaging apparatus according to an example of discussion;

FIG. 4A is a cross-sectional view showing a positional relationship between incident light on four light-transmitting regions in the example of discussion and a plurality of pixels located therebelow;

FIG. 5A is a diagram schematically showing an imaging apparatus according to a first embodiment;

FIG. 7 is a schematic view showing a configuration used in the present example;

FIG. 13 is a diagram for explaining an interference phenomenon of light;

FIG. 14A shows light whose spread of wavelength centered at the wavelength $\lambda_0$ is zero;

FIG. 14B shows that the coherence length reaches an infinite value;

FIG. 14C shows light whose spread of wavelength centered at the wavelength $\lambda_0$ is $\alpha\lambda$;

DETAILED DESCRIPTION

Underlying Knowledge Forming Basis of the Present Disclosure

Prior to a description of an embodiment of the present disclosure, results of detailed discussion on conventional methods for measuring the coherence or phase of light are explained.

Figure 12A:
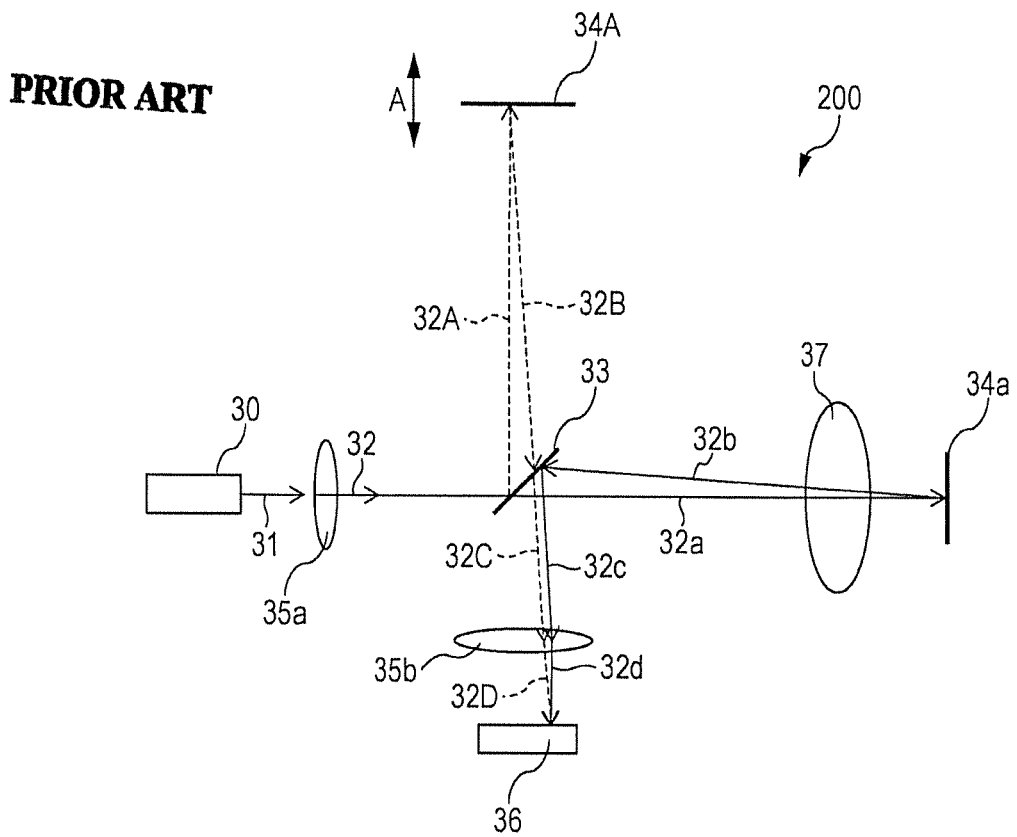
FIG. 12A is a diagram schematically showing a configuration of a Michelson's interferometer according to a first conventional example.

FIG. 12A is a diagram schematically showing a configuration of a Michelson's interferometer 200 according to a first conventional example. As shown in FIG. 12A, light 31 emitted from a light source 30 is condensed by a first lens optical system 35a to turn into parallel light 32. It should be noted that FIG. 12A shows only the optical axis of the parallel light 32. Light 32a, which is a portion of this parallel light 32, is transmitted by a semitransparent mirror 33 and travels toward a first reflecting mirror 34a. Light 32b reflected from the first reflecting mirror 34a is further reflected by the semitransparent mirror 33 as light 32c that travels toward a second lens optical system 35b. The light 32c passes through the second lens optical system 35b and, as light 32d, enters a photodetector 36 located on a focal plane of the second lens optical system 35b. Meanwhile, light 32A, which is another portion of the parallel light 32, is reflected by the semitransparent mirror 33 and travels toward a second reflecting mirror 34A. Light 32B reflected from the second reflecting mirror 34A travels toward the semitransparent mirror 33, is transmitted by the semitransparent mirror 33, and travels as light 32C toward the second lens optical system 35b. The light 32C passes through the second lens optical system 35b and, as light 32D, enters the photodetector 36 in such a form as to overlap the light 32d. The photodetector 36 detects light that is generated by interference between the light 32d and the light 32D. The second reflecting mirror 34A is configured to change its position along the direction (arrow A) of the normal to the plane of reflection. Along with a change in position of the second reflecting mirror 34A, the phase of the light 32D relative to the light 32d changes.

Figure 12B:
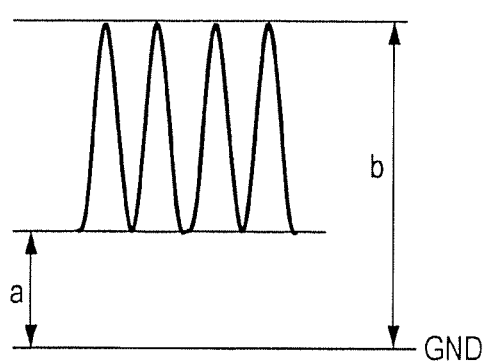
FIG. 12B is a diagram schematically showing an example of a time change in an electrical signal representing the intensity of light as detected by a photodetector.

FIG. 12B is a diagram schematically showing an example of a time change in an electrical signal representing the intensity of light as detected by the photodetector 36. FIG. 12B shows a method for evaluating the coherence and phase of light with the Michelson's interferometer 200. In FIG. 12B, the vertical axis represents the strength of a signal that is outputted from the photodetector 36, and the horizontal axis represents time. As shown in FIG. 12B, changing the position of the second reflecting mirror 34A over time causes the signal strength to change within a range of a to b. Note here that the value of (b−a)/(b+a) is called "contrast in interference". The degrees of coherence of light 31 is defined according to the value of contrast.

Even in a case where the second reflecting mirror 34A is fixed and a transparent object 37 is placed between the semitransparent mirror 33 and the first reflecting mirror 34a, the same principles hold as those which hold in a case where the position of the second reflecting mirror 34A is changed. That is, in the strength of a signal that is outputted from the photodetector 36, such as an image sensor, a difference in strength in conformance with the shape of the object 37 appears as a spatial distribution to form so-called interference fringes. The shape or phase information of the object 37 can be measured by measuring the shape of or the intervals between the interference fringes.

In order to measure the spatial distribution of the interference fringes at once, the photodetector 36 may be an aggregate of detectors each of which detects an amount of light that enters that detector. Individual photodetectors constituting the aggregate of detectors are also called "pixels".

FIG. 13 is a diagram for explaining an interference phenomenon of light. FIG. 13 schematically shows the appearance at a point in time $t_0$ of light that is emitted from the light source 30 and propagates in a Z direction. As shown in FIG. 13, a plurality of wave packets such as wave packets 38a and 38b are emitted one after another from the light source 30. The length $\sigma_0$ of a wave packet is called "coherence length". One wave packet includes a series of waves that are uniform in wavelength. Different wave packets have no phase correlation with each other. For example, $\delta_0 \neq \delta_0'$, where $\delta_0$ is the phase of the wave packet 38a and $\delta_0'$ is the phase of the wave packet 38b. Different wave packets may differ in wavelength from each other. For example, $\lambda_0 \neq \lambda_0'$, where $\lambda_0$ is the phase of the wave packet 38a and $\lambda_0'$ is the phase of the wave packet 38b.

First, a case is described where interference between portions 38A and 38A' of the wave packets 38a shown in FIG. 13 is caused by adjusting the position of the second reflecting mirror 34A in the configuration shown in FIG. 12A. Waves in the portion 38A and waves in the portion 38A' are equal in wavelength to each other and are also temporally stable in phase difference between waves. Therefore, the brightness and darkness of light after interference (amplitude of interfering light) are also temporally stable. That is, as shown in the lower left part of FIG. 13, interfering light 39a appears bright (in the upper row of the lower left part) or appears dark (in the lower row of the lower left part) according to the amount of phase difference (i.e. the change in position of the reflecting mirror 34A). This state is called "coherent".

Next, a case is described where interference between the portion 38A of the wave packet 38a and a portion 38B of the wave packet 38b is caused. In this case, there is no guarantee that the waves in the portion 38A and the waves in the portion 38B are equal in wavelength to each other, and the phase difference between these two types of waves also randomly changes over time. As a result, the brightness and darkness of light after interference (amplitude of interfering light) randomly change over time. These changes occur, for example, at speeds of the order of femtoseconds. Therefore, as shown in the lower right part of FIG. 13, interfering light 39b repeats its brightness and darkness alternately at high speeds and only appears to the human eye to be of average brightness. This state is called "incoherent". Laser light has a long wave packet and a coherence length of approximately several meters of several hundreds of meters and, as such, is a typical example of coherent light. Meanwhile, sunlight has a short wave packet and a coherence length of approximately 1 µm and, as such, is a typical example of incoherent light. In the case of interference of light in such a configuration as that shown in FIG. 12A, use of light of long coherence length, such as laser light, gives a high probability of interference within the same wave packet. As a result, the contrast improves to approximately 1. Meanwhile, use of light of short coherence length, such as sunlight, gives a high probability of interference between different wave packets (i.e. a low probability of interference between the same wave packets). As a result, the contrast lowers to approximately 0.

Figure 14D:
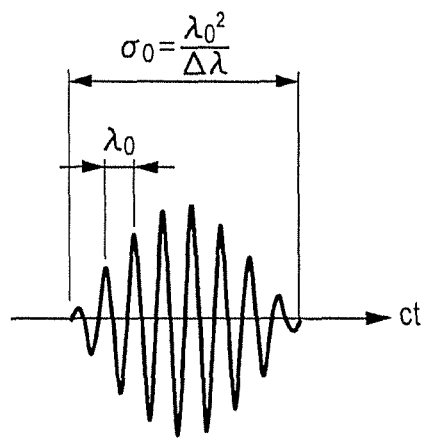
FIG. 14D shows that the coherence length $\sigma_0$ becomes $\lambda_0^2/\Delta\lambda$.

FIGS. 14A to 14E show a relationship between the spread of wavelength (longitudinal mode bandwidth) and coherence length of light with a center wavelength $\lambda_0$. FIG. 14A shows light whose spread of wavelength centered at the wavelength $\lambda_0$ is zero. In this case, as shown in FIG. 14B, the coherence length reaches an infinite value. FIG. 14C shows light whose spread of wavelength (FWHM) centered at the wavelength $\lambda_0$ is $\Delta\lambda$. In this case, as shown in FIG. 14D, the coherence length $\sigma_0$ becomes $\lambda_0^2/\Delta\lambda$. The longitudinal mode bandwidth and the coherence length are in a relationship of Fourier transform. This is called "Wiener-Khinchin theorem". This theorem can be explained as follows.

Figure 14E:
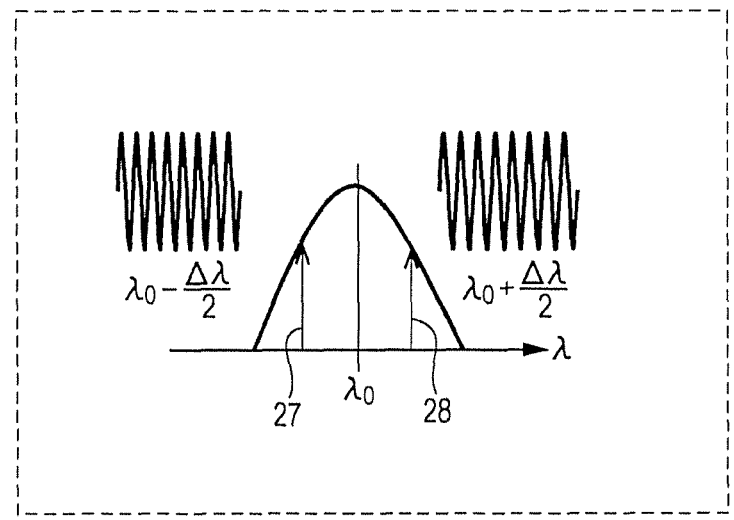
FIG. 14E shows that light whose center wavelength is $\lambda_0$ and whose spread of wavelength is $\Delta\lambda$ can be expressed by substitution with two rays of light with wavelengths of $\lambda_0-\Delta\lambda/2$ and $\lambda_0+\Delta\lambda/2$.

FIG. 14E shows that light whose center wavelength is $\lambda_0$ and whose spread of wavelength is $\Delta\lambda$, can be expressed by substitution with two rays of light 27 and 28 with wavelengths of $\lambda_0-\Delta\lambda/2$ and $\lambda_0+\Delta\lambda/2$. The period of a beat that is generated by interference between the light 27 and the light 28 is $\lambda_0^2/\Delta\lambda$. The wavelength of a carrier wave is the average value $\lambda_0$ of the wavelengths of the light 27 and the light 28. An oscillatory waveform of light is uniformly continuous within the period of the beat. Meanwhile, an oscillatory waveform of light of a different period loses its continuity, thus also losing its phase correlation. That is, the period $\lambda_0^2/\Delta\lambda$, of the beat is equivalent to the coherence length. The reason why sunlight is incoherent is that sunlight is large in spread of wavelength (longitudinal mode bandwidth) $\Delta\lambda$. Assuming that the center wavelength $\lambda_0$ is 550 nm and the spread of wavelength $\Delta\lambda$ is 300 nm, the coherence length $\sigma_0$ is given as $\lambda_0^2/\Delta\lambda=1.0$ µm.

Next, a photo-detection system disclosed in "Near-infrared Spectroscopy in a 1-µm Wavelength Region: Current and Future" (14th Annual Meeting of Japanese Society for Medical Near Infrared Spectroscopy, p. 139-144, Goro Nishimura) is described as a second conventional example. This photo-detection system measures an intensity distribution of light by propagation distance of light.

Figure 15A:
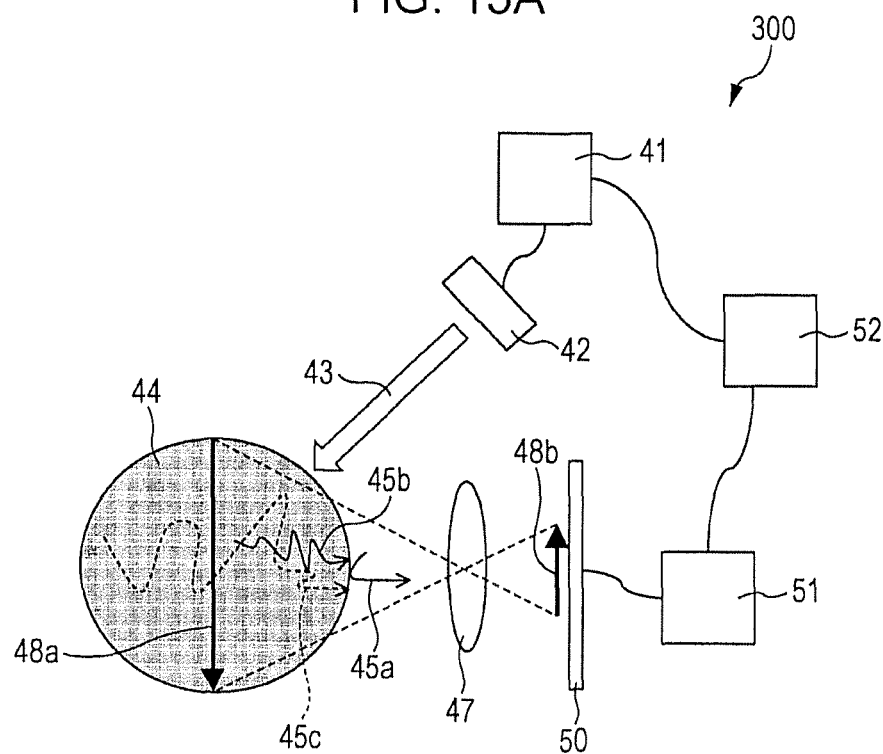
FIG. 15A is a schematic cross-sectional view of a photodetection system according to a second conventional example.

FIG. 15A is a schematic cross-sectional view of a photo-detection system 300 according to the second conventional example. A light source 42 emits laser light. As shown in FIG. 15A, light 43 of a wavelength $\lambda_0$ emitted from the light source 42 is applied to an object 44. As a result, scattering rays of light 45a, 45b, and 45c generated on a surface of or within the object 44 are condensed by the lens optical system 47 to form an image 48b in an image surface position of the lens optical system 47. Present in correspondence with the image 48b is a substantial object 48a on an object side of the lens. Disposed in the image surface position is a photodetector 50. The photodetector 50 is an aggregate of detectors (i.e. pixels) each of which detects an amount of light that enters that pixel. Emission of light from the light source 42 is controlled by a controller 41. An amount of light detected by the photodetector 50 is processed as a detected signal by an arithmetic circuit 51. The controller 41 and the arithmetic circuit 51 are controlled in block by a computer 52.

Figure 15B:
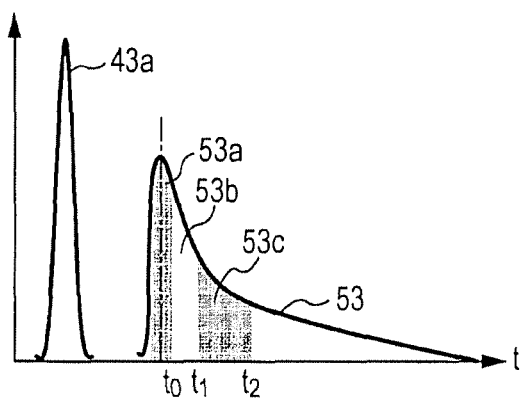
FIG. 15B is an explanatory diagram showing a relationship between the oscillation of a light source in the photodetection system shown in FIG. 15A and a detected signal from a photodetector.

FIG. 15B is an explanatory diagram showing a relationship between the oscillation of the light source 42 in the photo-detection system 300 shown in FIG. 15A and a detected signal from the photodetector 50. In FIG. 15B, the vertical axis represents the oscillation intensity of the light source 42 or the detection intensity of the photodetector 50, and the horizontal axis represents elapsed time. The light source 42 generates a pulse 43a under the control of the controller 41. Light 43 based on this pulse 43a is scattered within the object 44, received by the photodetector 50, and detected as a signal 53. The signal 53 is wider in time width than the original pulse 43a under the influence of variations in optical length due to the scattering. A leading output 53a of the signal 53 is a signal component based on light 45a reflected on the surface of the object 44. An output 53b during a period from time $t_0$ to time $t_1$ after the output 53a is a signal component based on light 45b that scatters a short distance within the object 44. An output 53c during a period from time $t_1$ to time $t_2$ after the output 53b is a signal component based on light 45c that scatters a long distance. Control by the computer 52 allows the arithmetic circuit 51 to time-divide the signal 53, so that the outputs 53a, 53b, and 53c can be separately detected. The light passes through the object 44 from a shallow side of the object 44 to a deep side of the object 44 in the order of the outputs 53a, 53b, and 53c. Therefore, information of different depths can be separately analyzed.

According to the inventor's discussion, the rays of light 32B and 32C from the second reflecting mirror 34A are needed to measure a degree of coherence or a phase by using the Michelson's interferometer 200 according to the first conventional example. This makes a complex configuration. Further, the presence of an interfering light path in a predetermined space increases susceptibility to a change (e.g. air convection or vibration) in ambient environment.

Meanwhile, according to the inventor's discussion, the photo-detection system 300 according to the second conventional example is limited in time-division width. Therefore, it is difficult to ensure sufficient depth resolution in performing measurements. For example, assuming the time-division width is 300 ps, the depth resolution is approximately 90 mm. For this reason, the photo-detection system 300 according to the second conventional example is not suited for diagnosing or inspecting a target having a comparatively small structure, such as a living organism.

Next, prior to a description of an embodiment of the present disclosure, an example of discussion, i.e. an embodiment that the inventor discussed to address the problems of the conventional examples, is described.

Example of Discussion

FIG. 1 is a diagram schematically showing an imaging apparatus 100 according to the example of discussion. The imaging apparatus 100 includes a light source 2, a lens optical system 7, an image sensor 13, a signal processing circuit 17, and a control circuit 1. The signal processing circuit 17 includes a moving image acquirer 14, an interpolation processor 15, and an arithmetic operator 16.

The light source 2 irradiates an object 4 with light 3 of a certain coherence length. For example, the light source 2 may be a laser light source that emits laser light, which is a typical example of coherent light. The light source 2 may continuously emit light of constant intensity or may emit single pulsed light. The light source 2 may emit light of any wavelength. However, in a case where the object 4 is a living organism, the wavelength of the light source 2 may be set, for example, at approximately 650 nm or longer and approximately 950 nm or shorter. This wavelength range is included in the wavelength range of red to near-infrared radiation. It is assumed herein that infrared radiation and ultraviolet radiation as well as visible light are encompassed in the concept of "light".

The lens optical system 7 is for example a condensing lens and condenses scattering rays 5a and 5A of light generated on a surface of or within the object 4 by the light source 2 irradiating the object 4 with light. The light thus condensed forms an image 8b in an image surface position of the lens optical system 7. Present in correspondence with the image 8b is a substantial object 8a on an object side of the lens. In the example shown in FIG. 1, the lens optical system 7 includes one lens. The optical lens system 7 may be an aggregate of lenses.

The image sensor 13 is disposed in the image surface position of the lens optical system 7. The image sensor 13 detects the scattering rays of light 5a and 5A condensed by the lens optical system 7. A structure of the image sensor 13 will be described in detail later.

The signal processing circuit 17 processes, in response to a control signal from the control circuit 1, an electrical signal that is outputted from a photodetector of the image sensor 13, and outputs a signal or data associated with the coherence of reflected light from the object 4. Such a signal or data may for example be image data representing a two-dimensional distribution of the degree of coherence of incident light.

The moving image acquirer 14 acquires, as a detected image, a signal representing an amount of light detected by the photodetector of the image sensor 13 and sends out a moving image including a plurality of frames of detected image to the interpolation processor 15. It should be noted that a signal representing an image is herein sometimes simply referred to as "image". The moving image acquirer 14 is equivalent to an input interface of the signal processing circuit 17.

The interpolation processor 15 performs interpolations to determine the amount of light of a missing pixel included in each frame of detected image. The interpolation processor 15 constructs interpolated images, i.e. detected images finished with interpolation, and sends out the interpolated images to the arithmetic operator 16. Interpolation processing will be described in detail later.

The arithmetic operator 16 performs arithmetic processing on the interpolated images to generate an optical distribution image, i.e. an arithmetically-processed image. The interpolation processor 15 and the arithmetic operator 16 may be image processing circuits such as digital signal processors (DSPs).

The control circuit 1 executes a program recorded, for example, in a memory and thereby controls at least one of the following: the detection of light by the image sensor 13, the arithmetic processing that is performed by the arithmetic operator 16, the amount of light that is emitted by the light source 2, the timing of lighting of the light source 2, the duration of continuous lighting of the light source 2, the emission wavelength of the light source 2, the coherence length of the light source 2, and the like. The control circuit 1 may be an integrated circuit such as a central processing unit (CPU) or a microcomputer. The control circuit 1, the moving image acquirer 14, the interpolation processor 15, and the arithmetic operator 16 may be realized by an integrated circuit. The control circuit 1, the moving image acquirer 14, the interpolation processor 15, and the arithmetic operator 16 may be realized by a program on a computer.

It should be noted that the imaging apparatus 100 may include a display (display section; not illustrated) that displays the results of arithmetic processing performed by the arithmetic operator 16. The display section may be one that displays an arithmetically-processed image (i.e. an optical distribution image). The display section may be one that displays, as numerical values, the results (such as the average of amounts of light, variance of distribution of amounts of light, and the area of a region whose amount of light is equal to or larger than or equal to or smaller than a predetermine value) of calculation based on an arithmetically-processed image. The display section may be one that displays indices (e.g. "normal" and "abnormal"; "good", "average", and "poor"; and the like) into which the numerical values have been converted.

Figure 2A:
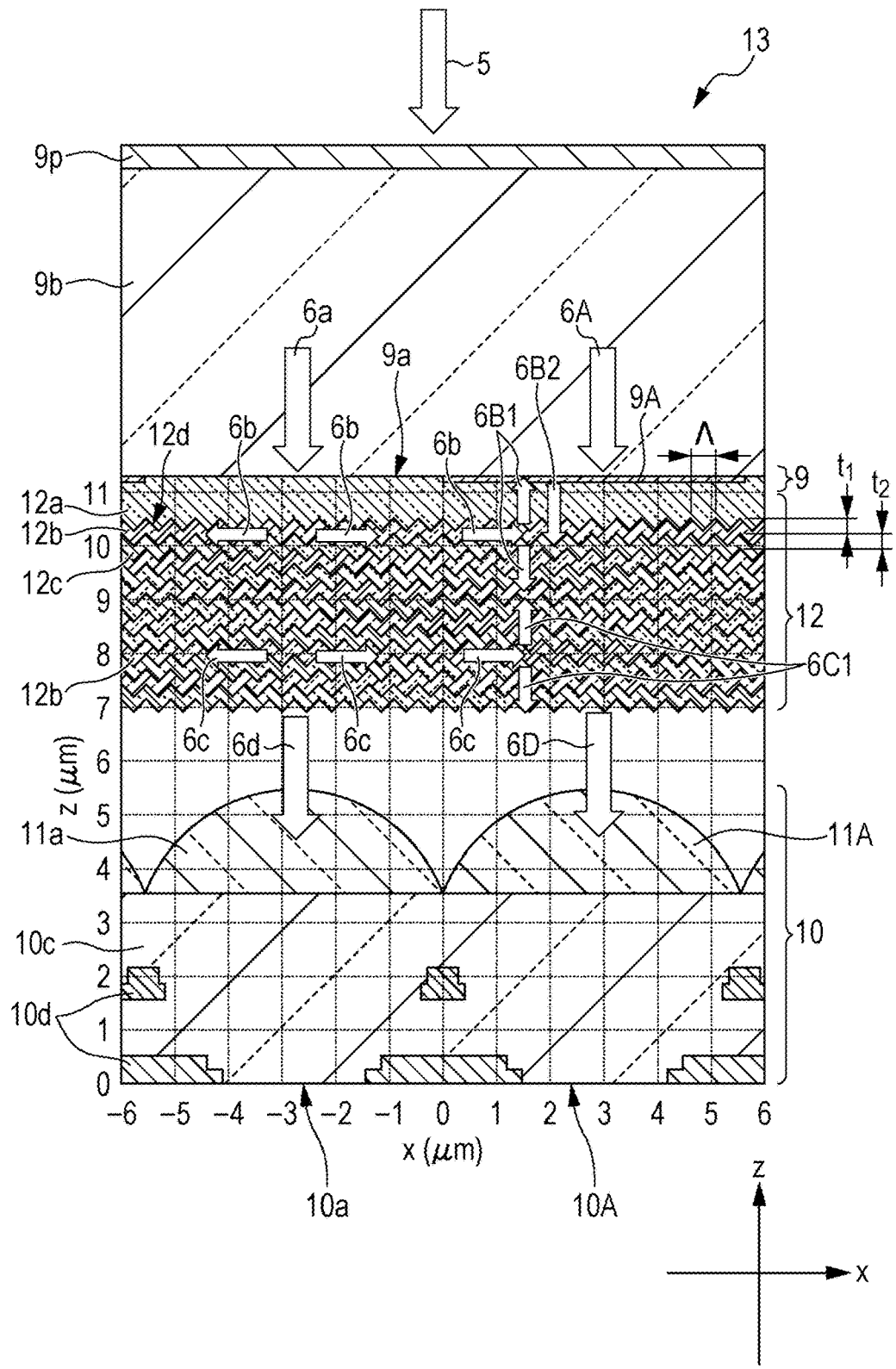
FIG. 2A is a cross-sectional view of an image sensor as taken along a plane extending along a direction of incidence of light.
Figure 2B:
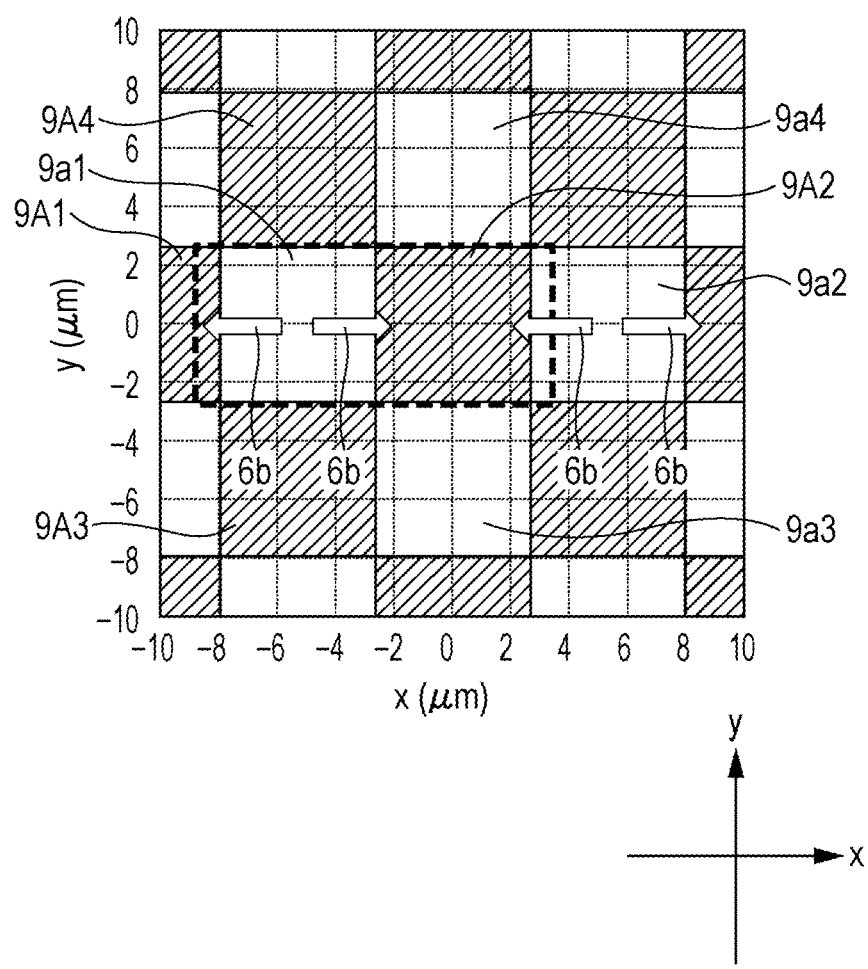
FIG. 2B is a plane view of the image sensor as looked at from a side thereof which light enters.

FIG. 2A is a cross-sectional view of the image sensor 13 as taken along a plane extending along a direction of incidence of light. FIG. 2B is a plane view of the image sensor 13 as looked at from a side thereof which light enters (i.e. a plane view taken along an XY plane including the after-mentioned light-shielding film 9). FIG. 2A shows a cross-section that is parallel to an XZ plane including a region surrounded by dotted lines of FIG. 2B. As shown in FIG. 2B, assuming that the cross-sectional structure shown in FIG. 2A is one unit structure, these unit structures are periodically arranged in the XY plane. It should be noted, for convenience of explanation, FIGS. 2A and 2B show three orthogonal axes (namely, an X axis, a Y axis, and a Z axis). The same coordinate axes apply to other drawings.

The image sensor 13 includes a photodetector 10, an optically-coupled layer 12, and a light-shielding film 9 in this order. In the example shown in FIG. 2A, the photodetector 10, the optically-coupled layer 12, and the light-shielding film 9 are stacked in a Z direction. Further, in the example shown in FIG. 2A, the image sensor 13 includes a transparent substrate 9b and a bandpass filter 9p in this order on top of the light-shielding film 9. The image sensor 13 has an "imaging area" on which a plurality of pixels are arranged.

The photodetector 10 includes a plurality of pixels in an in-plane direction (in the XY plane) of the photodetector 10. The plurality of pixels include first pixels 10a and second pixels 10A. The photodetector 10 includes a photosensitive portion formed by microlenses 11a and 11A, a transparent film 10c, metal films 10d such as wires, and a Si or organic film, and the like, starting from the side which light enters. The areas in the photosensitive portion located in gaps in the metal films 10d are equivalent to the pixels 10a and 10A. The plurality of microlenses 11a and 11A are disposed so that one microlens faces one pixel. Light condensed by the microlenses 11a and 11A and entering the gaps in the metal films 10d is detected by the first pixels 10a and the second pixels 10A, respectively.

The optically-coupled layer 12 is disposed on top of the photodetector 10 and includes a first transparent layer 12c, a second transparent layer 12b, and a third transparent layer 12a in this order in a direction perpendicular to the surface of the photodetector 10 (i.e. a Z-axis direction). The first transparent layer 12c and the third transparent layer 12a may be formed, for example, $SiO_2$ or the like. The second transparent layer 12b is formed, for example, by $Ta_2O_5$ or the like.

The second transparent layer 12b is higher in refractive index than the first transparent layer 12c and the third transparent layer 12a. The optically-coupled layer 12 may include a structure in which the second transparent layer 12b, which is a high-refractive-index transparent layer, and the first transparent layer 12c, which is a low-refractive-index layer, are further repeated in this order. FIG. 2A shows a structure in which the second transparent layer 12b and the first transparent layer 12c are repeated a total of six times. The second transparent layer 12b, which is a high-refractive-index transparent layer, is sandwiched between the first transparent layer 12c and the third transparent layer 12a, which are low-refractive-index layers. Therefore, the second transparent layer 12b functions as a waveguide layer. Gratings 12d, which are linear gratings of pitches Δ, are formed all over the interfaces between the second transparent layer 12b and the first transparent layer 12c and between the second transparent layer 12b and the third transparent layer 12a. The grating vector of each of the gratings 12d is parallel to the X axis in the in-plane direction (XY plane) of the optically-coupled layer 12. The XZ cross-sectional shape of the grating 12d is sequentially transferred onto the second transparent layer 12b and the first transparent layer 12c on which the grating 12d is stacked. In a case where the deposition of the second transparent layer 12b and the first transparent layer 12c is highly oriented in the direction in which they are stacked, shape transferability is easily maintained by forming the XZ cross-section of the grating 12d into an S or V shape.

It should be noted that the grating 12d needs only be included in a part of at least the second transparent layer 12b. The inclusion of the grating 12d in the second transparent layer 12b allows incident light to be coupled to guided light, i.e. light that propagates through the second transparent layer 12b.

It is preferable that a space between the optically-coupled layer 12 and the photodetector 10 be as narrow as possible. The optically-coupled layer 12 and the photodetector 10 may be in intimate contact with each other. The space between the optically-coupled layer 12 and the photodetector 10 (including a space in which the microlenses 11a and 11A are arranged) may be filled with a transparent medium such as an adhesive. In a case where the space is filled with the transparent medium, the microlenses 11a and 11A are made of a material having a greater refractive index than the transparent medium with which the space is filled, in order that the microlenses 11a and 11A bring about a lens effect.

The light-shielding film 9 has a structure in which a plurality of light-shielding regions 9A and a plurality of light-transmitting regions 9a are two-dimensionally arranged. In the example shown in FIG. 2A, the light-shielding regions 9A and the light-transmitting regions 9a are formed by patterning, on the after-mentioned transparent substrate 9b, a metal reflecting film formed, for example, by aluminum (Al) or the like. An aggregate of light-shielding regions 9A is herein sometimes referred to as "light-shielding region group", and an aggregate of light-transmitting regions 9a is herein sometimes referred to as "light-transmitting region group".

The light-transmitting regions 9a in FIG. 2A correspond to light-transmitting regions 9a1, 9a2, 9a3, and 9a4 and the like in FIG. 2B. The light-shielding regions 9A in FIG. 2A correspond to light-shielding regions 9A1, 9A2, 9A3, and 9A4 and the like in FIG. 2B. That is, the light-shielding film 9 has the plurality of light-shielding regions 9A and the plurality of light-transmitting regions 9a arranged in an in-plane direction (in the XY plane) of the light-shielding film 9. The plurality of light-shielding regions 9A face the plurality of second pixels 10A, respectively. The plurality of light-transmitting regions 9a face the plurality of first pixels 10a, respectively. An aggregate of first pixels 10a is herein sometimes referred to as "first pixel group", and an aggregate of second pixels 10A is herein sometimes referred to as "second pixel group".

It should be noted that two or more first pixels 10a may face one light-transmitting region. Similarly, two or more second pixels 10A may face one light-shielding region. The present disclosure also encompasses such an embodiment.

In the example shown in FIG. 2B, the plurality of light-shielding regions 9A1, 9A2, 9A3, and 9A4 form a checkered pattern. These light-shielding regions 9A1, 9A2, 9A3, and 9A4 may form a pattern other than the checkered pattern.

Figure 2C:
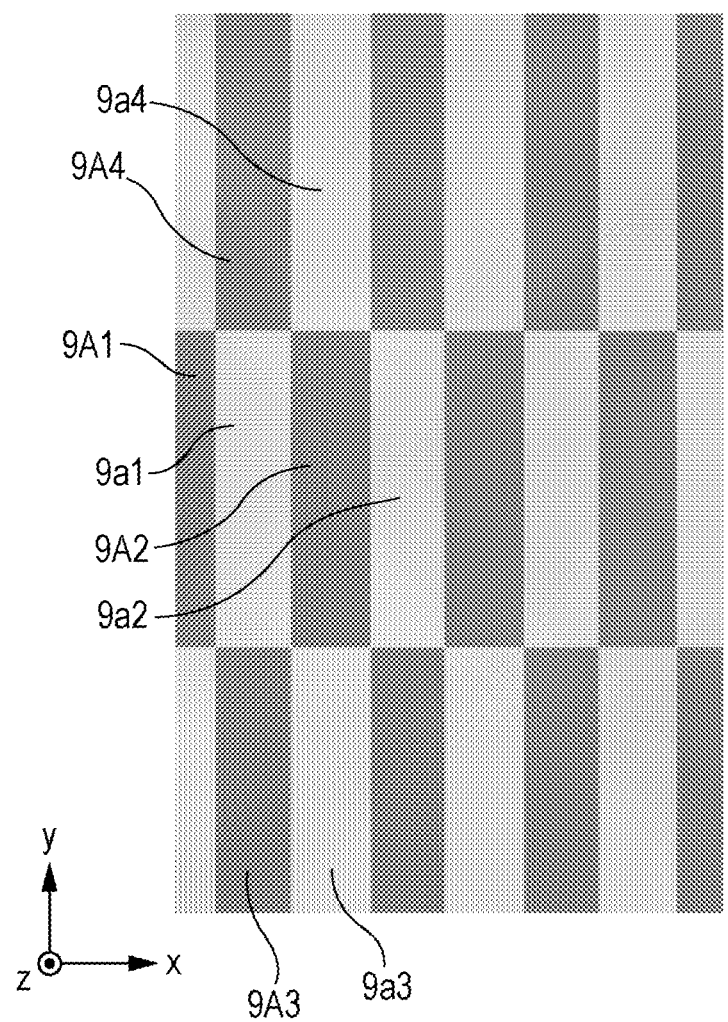
FIG. 2C shows an example of a light-shielding film having a stripe pattern.
Figure 2D:
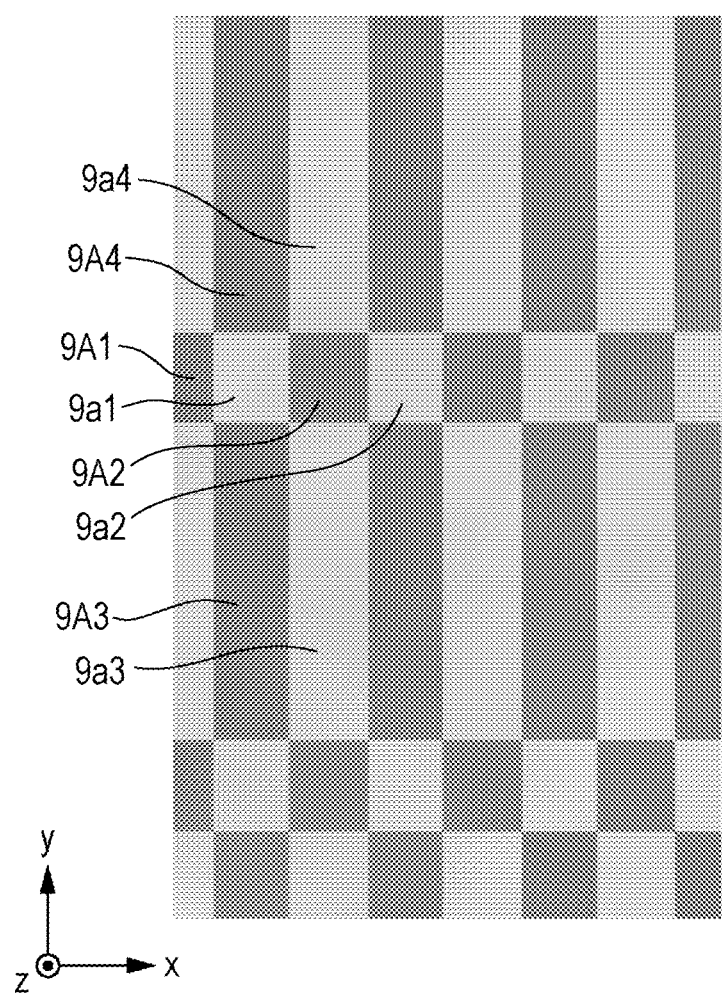
FIG. 2D shows an example of a light-shielding film having another pattern.

FIG. 2C shows an example of a light-shielding film 9 having a stripe pattern. FIG. 2D shows an example of a light-shielding film 9 having another pattern. Each of these patterns needs only be an alternate arrangement of light-transmitting regions 9a and light-shielding regions 9A in the waveguide direction of light in at least the optically-coupled layer 12. That is, each of these patterns needs only be an arrangement of both light-transmitting regions 9a and light-shielding regions 9A.

The transparent substrate 9b is disposed on a side of the light-shielding film 9 which light enters. The transparent substrate 9b may be formed by a material such as $SiO_2$. The bandpass filter 9p is disposed on the side of the transparent substrate 9b which light enters. The bandpass filter 9p selectively transmits only a portion of incident light 5 near the wavelength $\lambda_0$.

The light 5 entering the image sensor 13 travels through the bandpass filter 9p and the transparent substrate 9b as rays of light 6A and 6a that reach the light-shielding regions 9A, which are provided with the reflecting film, and the light-transmitting regions 9a, from which the reflecting film has been removed, respectively. The light 6A is blocked by the light-shielding regions 9A. The light 6a is transmitted by the light-transmitting regions 9a and enters the optically-coupled layer 12. The light 6a having entered the optically-coupled layer 12 travels through the third transparent layer 12a and enters the second transparent layer 12b. The gratings 12d are formed at the interfaces on the top and bottom of the second transparent layer 12b. If Eq. (1) below is satisfied, guided light 6b is generated.

$$\sin \theta = N - \lambda_0/\Lambda \qquad \text{Eq. (1)}$$

Note here that N is the effective refractive index of the guided light 6b. θ is the angle of incidence with respect to the normal to the plane of incidence (XY plane). In FIG. 2A, light is incident perpendicularly to the plane of incidence (θ=0°). In this case, the guided light 6b propagates in an X direction in the XY plane. That is, light having traveled through the light-transmitting regions 9a and entered the optically-coupled layer 12 is guided toward the light-shielding regions 9A adjacent to the light-transmitting regions 9a in the X direction.

A component of light that is transmitted by the second transparent layer 12b and enters a lower layer enters all of the second transparent layers 12b located on a lower layer side. This causes guided light 6c to be generated under the same condition as Eq. (1). Although rays of guided light are generated on all of the second transparent layers 12b, FIG. 2A represents only rays of guided light that are generated on two layers. The guided light 6c, which is generated on the lower layer side, also propagates in the X direction in the XY plane. The rays of guided light 6b and 6c propagate while radiating light upward and downward at an angle θ (in the example shown in FIG. 2A, θ=0° with respect to the normal to the waveguide plane (XY plane). Those components of the rays of radiated light 6B1 and 6C1 which travel upward (toward the reflecting film) directly below the light-shielding regions 9A is reflected by the light-shielding regions 9A to turn into light 6B2 that travels downward along the normal to the plane of reflection (XY plane). The rays of light 6B1, 6C1, and 6B2 satisfy Eq. (1) with respect to the second transparent layers 12b. Therefore, portions of the rays of light 6B1, 6C1, and 6B2 turn back into the rays of guided light 6b and 6c. These rays of guided light 6b and 6c also generate new rays of radiated light 6B1 and 6C1. These processes are repeated. As a whole, directly below the light-transmitting regions 9a, a component that did not turn into guided light is transmitted by the optically-coupled layer 12 and enters the microlenses 11a as transmitted light 6d. As a result, the component that did not turn into guided light is detected by the first pixels 10a. In actuality, a component that was finally radiated after being guided is added to the component that did not turn into guided light. However, such a component is treated herein as the component that did not turn into guided light. Directly below the light-shielding regions 9A, a component that turned into guided light is radiated and enters the microlenses 11A as transmitted light 6D. As a result, the component that turned into guided light is detected by the second pixels 10A.

The light-transmitting regions 9a are also apertures of the image sensor 13. Light splits through the light-transmitting regions 9a onto the pixels located directly below the light-transmitting regions 9a and the pixels located on either side of those pixels (i.e. adjacent to those pixels in the X direction) and is detected by each of the pixels.

The moving image acquirer 14 acquires, as a detected image, signals representing amounts of light detected by the first pixels 10a and/or the second pixels 10A of the photodetector 10. A moving image is a pixel group including a plurality of frames of detected image detected at different timings.

Let it be assumed that the amounts of light detected by the first pixels 10a facing the light-transmitting regions 9a1, 9a2, 9a3, and 9a4 shown in FIG. 2B are q1, q2, q3, and q4, respectively. Let it also be assumed that the amounts of light detected by the second pixels 10A facing the light-shielding regions 9A1, 9A2, 9A3, and 9A4 shown in FIG. 2B are Q1, Q2, Q3, and Q4, respectively. q1 to q4 represent the detected amounts of light that did not turn into guided light. Q1 to Q4 represent the detected amounts of light that turned into guided light. An amount of light that turned into guided light is not detected by the first pixel 10a located directly below the light-transmitting region 9a1. An amount of light that did not turn into guided light is not detected by the second pixel 10A located directly below the light-shielding region 9A2. Those pixels by which no amounts of light are detected are herein sometimes referred to as "missing pixels". Those pixels by which amounts of light are actually detected (i.e. those pixels other than the missing pixels) are herein sometimes referred to as "actual pixels". As for the light that turned into guided light, the second pixels 10A are actual pixels and the first pixels 10a are missing pixels. As for the light (transmitted light) that did not turn into guided light, the first pixels 10a are actual pixels and the second pixels 10A are missing pixels.

The interpolation processor 15 performs interpolations to determine the amount of light in a missing pixels of each frame of detected image. The interpolations may involve the use of the amounts of light that are detected by actual pixels located near the missing pixel. For example, the interpolations may involve the use of the amounts of light of pixels located directly below actual regions adjacent in the X direction and/or a Y direction with the missing pixel at the center. From a point of view of performing more accurate interpolations, it is preferable to use the amounts of light of pixels adjacent in the waveguide direction (in the example of discussion, the X direction) of light in the optically-coupled layer 12. A reason for this is that those pixels adjacent in the waveguide direction are higher in correlation with detected amounts of light than those pixels adjacent in a direction orthogonal to the waveguide direction (i.e. the direction in which less or no light is guided).

A calculating method for interpolation can use, for example, the average value of the amounts of light of two adjacent pixels. For example, for the first pixel 10a located directly below the light-transmitting region 9a1, the detected amount of light that turned into guided light is defined as Q0=(Q1+Q2)/2. Similarly, for the second pixel 10A located directly below the light-shielding region 9A2, the detected amount of light that did not turn into guided light is defined as q0=(q1+q2)/2.

By applying these definitions to all regions, the detected amount of light that did not turn into guided light and the detected amount of light that turned into guided light can be defined for all of the pixels of the photodetector 10.

The arithmetic operator 16 performs, for each frame of interpolated image, arithmetic processing such as the generation of an optical distribution image representing a distribution of degree of coherence using the detected amount of light that did not turn into guided light and the detected amount of light that turned into guided light as interpolated on the basis of such definitions as those described above. The arithmetic operator 16 generates an optical distribution image by calculating the value of the ratio between these two detected amounts of light (or the value of the ratio of each amount of light with respect to the sum of these amounts of light) for each pixel and assigning the value to that pixel.

Figure 3:
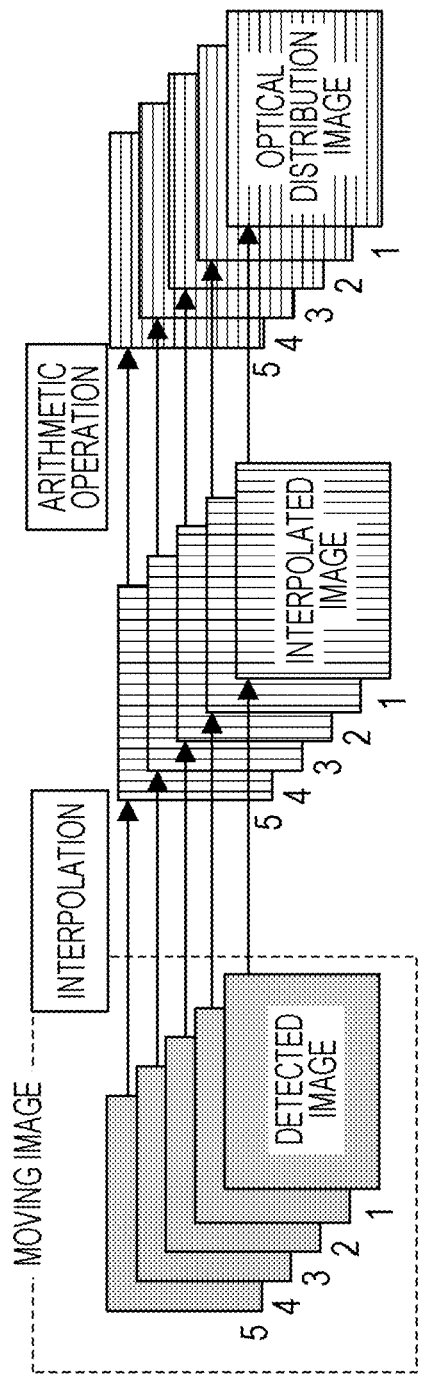
FIG. 3 shows the frame-by-frame flow of images from the acquisition of a moving image to the generation of an optical distribution image.

FIG. 3 shows the frame-by-frame flow of images from the acquisition of a moving image to the generation of an optical distribution image. A moving image is composed of a plurality of frames of detected image. One frame of detected image includes an image representing a distribution of the amounts of light detected by the first pixel group (i.e. light that did not turn into guided light) and/or the second pixel group (i.e. light that turned into guided light).

One frame of detected image is used to generate one frame of interpolated image. One frame of interpolated image includes an image obtained by interpolating a missing pixel of a detected image from the first pixel group and/or an image obtained by interpolating a missing pixel of a detected image from the second pixel group.

One frame of interpolated image is used to generate one frame of optical distribution image. One frame of optical distribution image includes images obtained by performing the after-mentioned arithmetic operations on the interpolated images from the first pixel group and the second pixel group.

FIG. 4A is a cross-sectional view showing a positional relationship between incident light on four light-transmitting regions 9a in the example of discussion and a plurality of pixels located therebelow. FIG. 4A assumes that there is a phase difference between light entering the left two light-transmitting regions 9a and light entering the right two light-transmitting regions 9a.

Figure 4B:
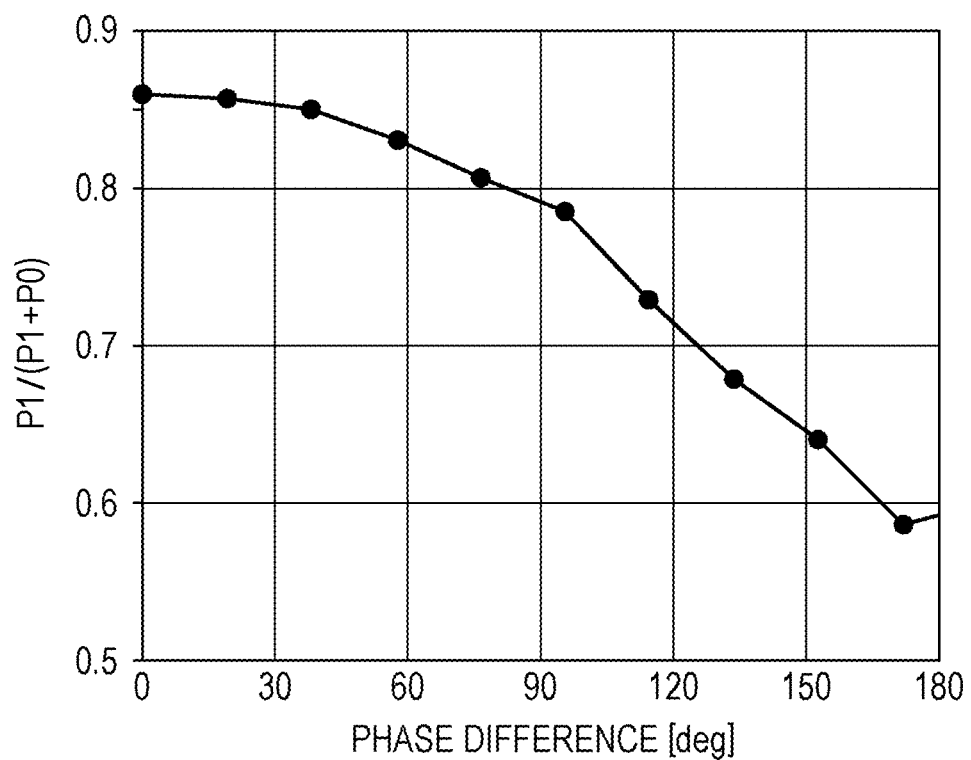
FIG. 4B shows an analysis result showing a relationship between a phase difference of incident light and a detected signal.

FIG. 4B shows an analysis result showing a relationship between a phase difference of incident light and a detected signal. In the analysis, the width W of each of the light-transmitting regions 9a and the light-shielding regions 9A in the X direction was 5.6 µm, the depth of each of the gratings 12d in the Z direction was 0.2 µm, each of the second transparent layers 12b was a $Ta_2O_5$ film, the thickness $t_1$ of each of the second transparent layers 12b in the Z direction was 0.34 µm, each of the first transparent layers 12c was a $SiO_2$ film, and the thickness $t_2$ of each of the first transparent layers 12c in the Z direction was 0.22 µm.

Let it be assumed that a pixel located directly below a light-shielding regions 9A is a second pixel 10A and pixels located directly below light-transmitting regions 9a adjacent to the light-shielding region 9A on both sides are first pixels 10a and 10a'. Let it also be assumed that the amounts of light detected by the second pixel 10A, the first pixel 10a, and the first pixel 10a' are P1, P0', and P0", respectively. That is, P0' and P0" represent signals from pixels belonging to the first pixel group, and P1 represents a signal from a pixel belonging to the second pixel group.

In consideration of the X-direction symmetry of the positions of the pixels with respect to the position of the incident light, the detected signal was defined as P1/(P1+P0), assuming that P0=(P0'+P0"). This analysis was conducted under conditions where the incident light was in a TE mode (S polarization).

According to the analysis result shown in FIG. 4B, the detected signal lowers as the phase difference increases. This shows that the degree of phase difference of the incident light can be measured on the basis of the magnitude of the detected signal. Therefore, an image representing a two-dimensional distribution of coherence (i.e. an optical distribution image) can be generated by acquiring the detected signal P1/(P1+P0) for each pixel. It should be noted that, instead of P1/(P1+P0), P1/P0 or the reciprocal thereof may be calculated as a signal value of each pixel of an optical distribution image. Although not described in detail here, a difference in coherence can also be measured by utilizing phase randomness.

However, it was found that, in the case of incidence of light whose phase spatially changes abruptly, the imaging apparatus 100 according to the example of discussion has difficulty in accurately determining the amount of light detected in a missing pixel. Therefore, the imaging apparatus 100 according to the example of discussion undesirably generates an optical distribution image that includes a pixel having an error.

To address this problem, the inventor conceived of a novel imaging apparatus that can precisely measure a degree of phase difference or coherence as an optical distribution image. The following is a brief overview of an aspect of the present disclosure.

An imaging apparatus according to an aspect of the present disclosure includes:

an image sensor for acquiring a moving image of an object, the image sensor including:

a light-shielding film including light-transmitting regions and light-shielding regions, the light-transmitting regions and the light-shielding regions being alternately arranged in at least a first direction within a plane;

a photodetector disposed opposite the light-shielding film, the photodetector having an imaging area, the photodetector including first pixels and second pixels, the first pixels and the second pixels being two-dimensionally arranged on the imaging area, each of the first pixels facing one of the light-transmitting regions, each of the second pixels facing one of the light-shielding regions; and an optically-coupled layer disposed between the light-shielding film and the photodetector, the optically-coupled layer including a grating which generates a propagating light that propagates in the first direction and a transmitting light that transmits the optically-coupled layer when light of a predetermined wavelength enters the light-transmitting regions;

an optical system that forms an image of the object on the imaging area;

a control circuit that causes the image sensor to acquire the moving image; and a signal processing circuit that extracts two different frames from among frames included in the moving image acquired by the image sensor.

Such a configuration makes it possible to generate a composite image with few errors by complementarily utilizing two frames of image signal that are extracted from among a plurality of frames. Such a composite image may be image data that represents a two-dimensional distribution of the degree of phase difference or coherence of incident light.

The following describes more specific embodiments of the present disclosure. It should be noted that each of the embodiments described below shows a general or specific example. In the embodiments described below, the numerical values, the shapes, the materials, the constituent elements, and the placement of the constituent elements are mere examples and not intended to limit the present disclosure. Those of the constituent elements in the embodiments described below which are not recited in an independent claim representing the most generic concept are described as optional constituent elements.

First Embodiment

As with the imaging apparatus according to the example of discussion, an imaging apparatus according to a first embodiment is used mainly for inspection of living tissue. A description of the first embodiment mainly details elements that are different from those of the example of discussion. Constituent elements that are the same as those of the example of discussion are given the same reference numerals.

FIG. 5A is a diagram schematically showing an imaging apparatus 120 according to the first embodiment. The imaging apparatus 120 includes an image processing circuit 22 in addition to the elements described in the example of discussion. The image processing circuit 22 is a constituent element of the signal processing circuit 17 and includes an image position calculator 23 and an image synthesizer 24. The operation of the image position calculator 23 and the image synthesizer 24 is controlled by the control circuit 20. The control circuit 20 controls the light source 2, the moving image acquirer 14, the interpolation processor 15, the image position calculator 23, the image synthesizer 24, and the arithmetic operator 16 by sending a control signal to each of these elements.

Figure 5B:
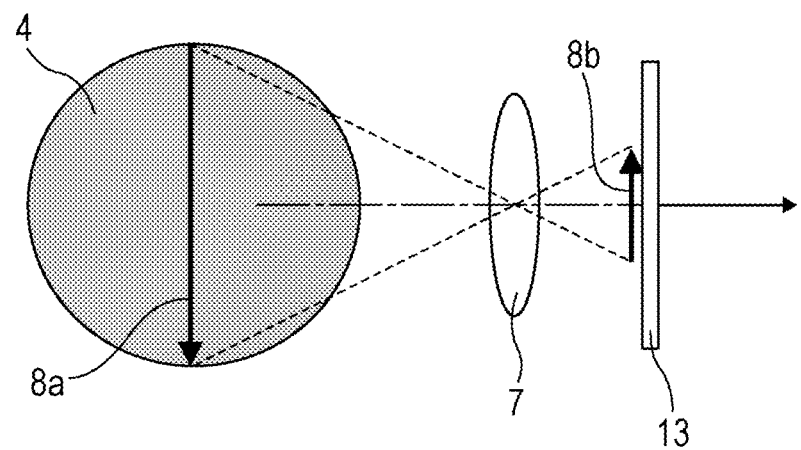
FIG. 5B is a diagram explaining a state where an image of an object moves on an image sensor when the object moves.
Figure 5C:
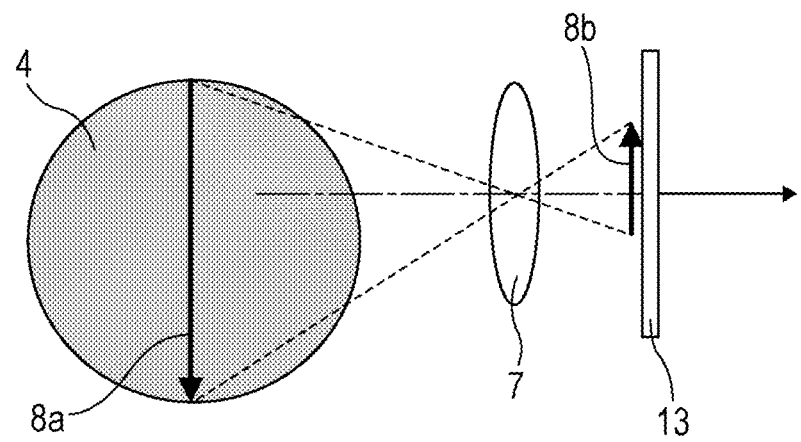
FIG. 5C is another diagram explaining a state where the image of the object moves on the image sensor when the object moves.

FIG. 5B is a diagram explaining a state where the image 8b of the object 4 moves on the image sensor 13 when the object 4 moves. FIG. 5C is another diagram explaining a state where the image 8b of the object 4 moves on the image sensor 13 when the object 4 moves. The position of the object 4 on the surface of paper of FIG. 5C is lower than the position of the object 4 on the surface of paper of FIG. 5B. Condensation by the lend optical system 7 of scattering light from the object 4 causes the image 8b of the object 4 to changes its position in an upward direction on the surface of paper as shown in FIG. 5C. That is, as the object 4 moves, the image 8b of the object 4 moves to a different position on the image sensor 13 and is formed there.

It is assumed that the direction of movement of the image 8b of the object 4 is a direction including the direction (i.e. the X direction) in which light having entered the optically-coupled layer 12 is guided. More accurate interpolations can be performed if the distance of movement of the image 8b of the object 4 is such a distance that the image 8b of the object 4 changes its position on the image sensor 13 by W or longer in the X direction. The distance of movement of the image 8b of the object 4 may be a substantially odd multiple of W.

The image position calculator 23 determines the direction and magnitude of displacement of the image 8b between two or more interpolated images differing in position of the image 8b of the object 4. The displacement may be calculated either from the amount of movement of the object 4 or by comparing similar parts of the plurality of interpolated images.

The image synthesizer 24 aligns the two or more interpolated images differing in position of the image 8b of the object 4 so that the displacement is eliminated, combines the interpolated images into one composite image, and outputs the composite image. In so doing, the image synthesizer 24 compares the amounts of light of each separate pixel between the plurality of interpolated images and, on the basis of a predetermined reference, determines a more accurate amount of light for each pixel. The image thus obtained is referred to as "composite image". The following is an example of a method for synthesis for each pixel. The following describes an example of a method for obtaining one composite image from two interpolated images. Note, however, that the present disclosure is not limited to such an example and, for example, one composite image may be generated by comparing three or more interpolated images.

Figure 5D:
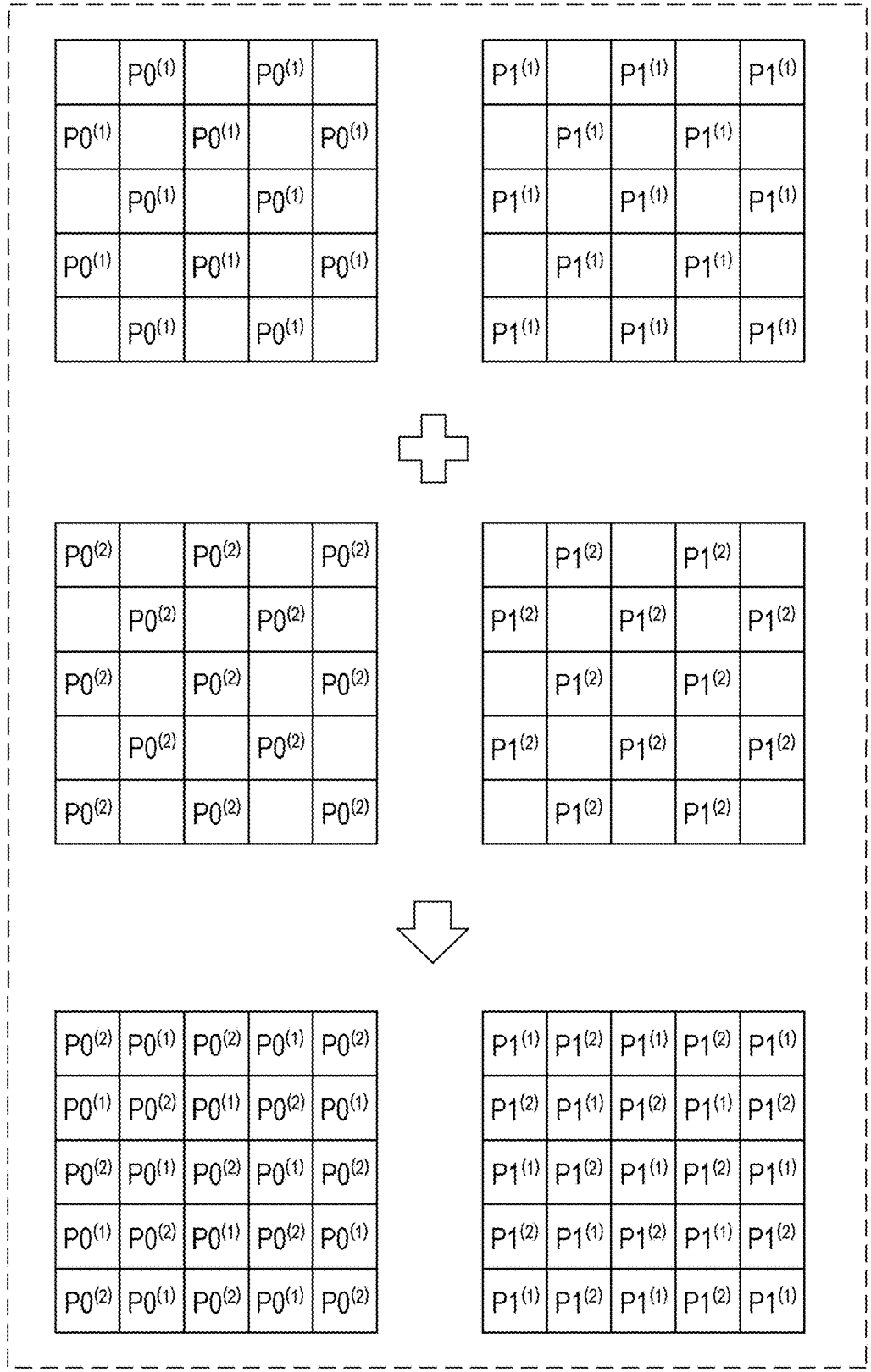
FIG. 5D is a diagram for explaining an example of a synthesis process.

FIG. 5D is a diagram for explaining an example of a synthesis process. The upper row of FIG. 5D schematically shows parts of two interpolated images that are obtained by a first one of two different frames. The middle row of FIG. 5D schematically shows parts of two interpolated images that are obtained by a second one of the two different frames. The lower row of FIG. 5D schematically shows parts of two composite images. These diagrams all represent the same pixel region. Two interpolated images that are obtained each time imaging is performed are an image regarding a transmitted light component P0 (i.e. a component that did not turn into guided light) of incident light and an image regarding a component P1 that turned into guided light. In the upper and middle rows of FIG. 5D, the actual pixels are assigned signs $P0^{(1)}$, $P1^{(1)}$, $P0^{(2)}$, and $P1^{(2)}$, and the missing pixels are denoted by blank boxes. $P0^{(1)}$ and $P1^{(1)}$ represent the values (actual values) of the amounts of light that are obtained from the first pixel group and the second pixel group, respectively, by the first frame. $P0^{(2)}$ and $P1^{(2)}$ represent the values (actual values) of the amounts of light that are obtained from the first pixel group and the second pixel group, respectively, by the second frame. It should be noted that although the values of the amounts of light vary from pixel to pixel, FIG. 5D assigns the same signs to all of the pixels. In these images, the value of the amount of light of a missing pixel is the average value (interpolated value) of the values of the amounts of light of actual pixels located on either side of the missing pixel.

In the example shown in FIG. 5D, the position of the image 8b of the object 4 in the second frame is displaced by one pixel in the X direction from the position of the image 8b of the object 4 in the first frame. As a result, a pixel that is an actual pixel in a first one of two images that are obtained by the second frame is a missing pixel in a second one of the two images. In such a case, that pixel in a composite image is preferentially assigned the value of the amount of light of the actual pixel. Such a method for synthesis is effective, for example, when the displacement of two detected images in the X direction is an odd multiple of the width W.

It should be noted that in a case where a pixel is an actual pixel in both of two interpolated images that are obtained by two different frames, the average value of the amounts of light of those actual pixels may be used as the value of the amount of light of that pixel in a composite image. Similarly, in a case where a pixel is a missing pixel in both of two detected images, the average value of the amounts of light of those missing pixels may be used as the value of the amount of light of that pixel in a composite image.

Operation

The following describes the operation of the first embodiment.

First, the control circuit 20 controls the moving image acquirer 14 and the interpolation processor 15 to acquire a moving image from the image sensor 13. The control circuit 20 performs interpolation processing on each frame of detected image that constitutes the moving image. This interpolation processing is the same as that of the aforementioned example of discussion. As a result of the interpolation processing, two image signals representing distributions of a transmitted light component (i.e. a component that did not turn into guided light) and a guided light component, respectively, of incident light (these image signals being also referred to as "detected images"). Each interpolated image (detected image finished with interpolation) is sent to the image processing circuit 22 and recorded in a memory (not illustrated) provided in the image processing circuit 22.

The control circuit 20 controls the image position calculator 23 and the image synthesizer 24 to extract two frames (or more) of interpolated image from among all of the frames of interpolated image stored in the memory and perform alignment and a synthesis process. This causes one composite image to be outputted from the image synthesizer 24. The interpolated images to be extracted may be randomly selected. As the interpolated images to be extracted, two or more contiguous frames of image may be selected or two or more frames of image may be selected at predetermined frame intervals. Alternatively, on the basis of a result of calculation made by the image position calculator 23, interpolated images with a shift of the image 8b of the object 4 in the waveguide direction of light in the optically-coupled layer 12 by an odd number of pixels may be selected. Note here that, as the value of the amount of light of each pixel of the composite image, the value of the amount of light of the actual pixel, of that pixel in the two frames of interpolated image, is preferentially used. Therefore, even if there is a missing pixel that could not be accurately interpolated in the aforementioned interpolation processing, the value of the amount of light of that pixel in the composite image may be replaced by the value of the amount of light of an actual pixel in the other frame. As a result, the percentage of missing pixels to all of the pixels becomes lower in the composite image than in a detected image. In other words, the probability of a pixel becoming a missing pixel becomes lower. Such a composite image is generated separately for a component (i.e. the aforementioned signal P0) of incident light that did not turn into guided light and a component (i.e. the aforementioned signal P1) of the incident light that turned into guided light.

The arithmetic operator 16 performs the same arithmetic processing as that of the example of discussion on the basis of two composite images generated by the image processing circuit 22. That is, the arithmetic operator 16 generates an optical distribution image whose pixels each has a pixel value of P1/(P1+P0), P1/P0, or the reciprocal thereof. This makes it possible to generate a more accurate optical distribution image, thus making it possible to precisely measure a degree of phase difference or coherence as an image.

In the first embodiment, the image processing circuit 22 is disposed in a stage preceding the arithmetic operator 16 to obtain a composite image from two interpolated frames of detected image. Alternatively, the image processing circuit 22 may be disposed in a stage following the arithmetic operator 16 to generate a synthesized new optical distribution image from two calculated frames of optical distribution image.

Figure 5E:
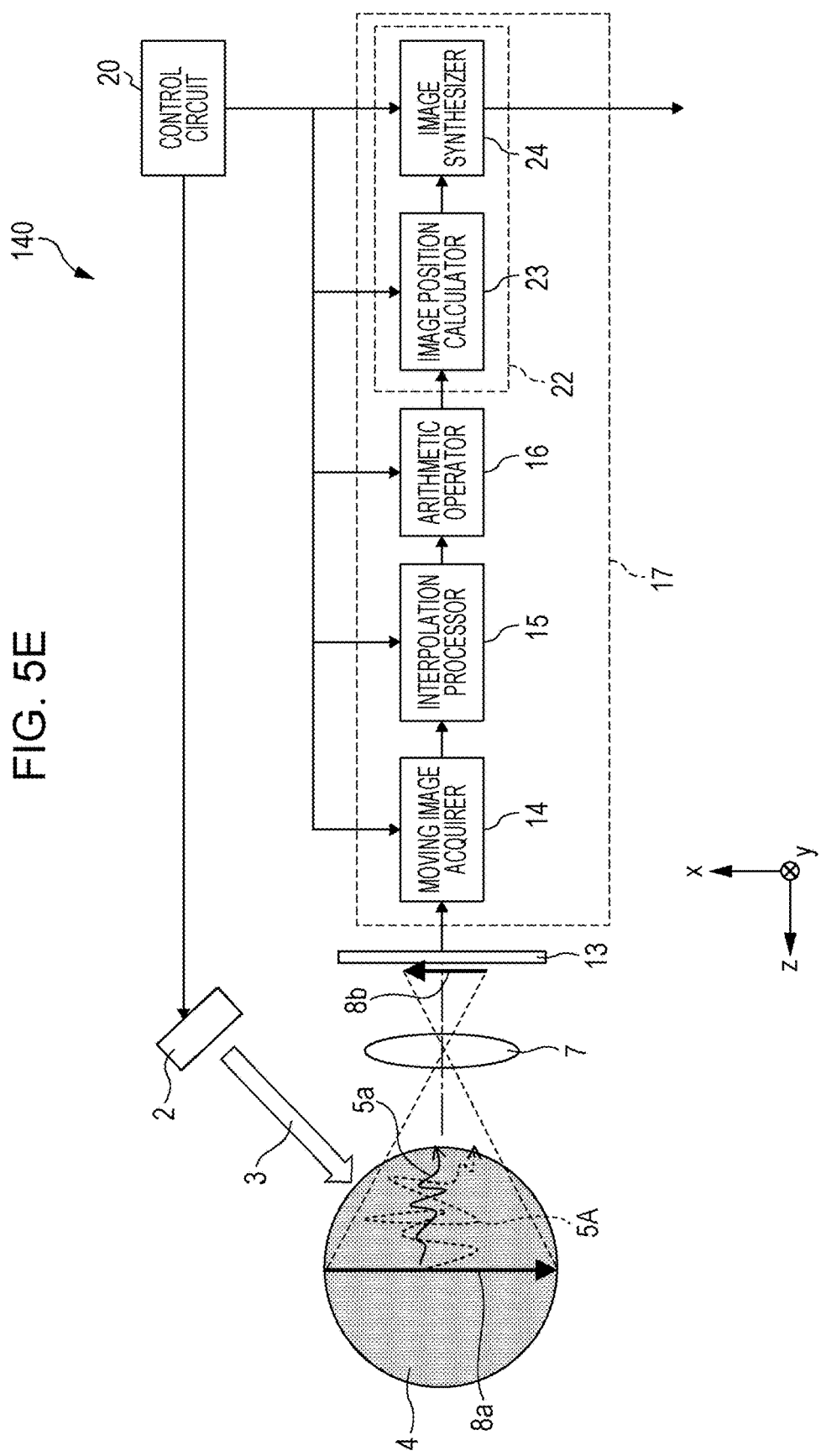
FIG. 5E is a diagram schematically showing an imaging apparatus according to a modification of the first embodiment.

FIG. 5E is a diagram schematically showing an imaging apparatus 140 according to a modification of the first embodiment. In this example, the arithmetic operator 16 generates an optical distribution image for each of two frames prior to the synthesis of an image. Each optical distribution image is generated by an arithmetic operation using an image signal (which represents the detected amount of light that did not turn into guided light) that is obtained by interpolation processing from a signal of the first pixel group and an image signal (which represents the detected amount of light that turned into guided light) that is obtained by interpolation processing from a signal of the second pixel group. A missing pixel in the first pixel group and a missing pixel in the second group have a complementary relationship with each other. Therefore, in an image finished with arithmetic processing, a missing pixel cannot be defined as described with reference to FIG. 5A.

As a method for synthesis in such a case, for example, a missing pixel of the pixel group that is expected to have more errors as a result of interpolation need only be defined as a missing pixel. Apart from this, for example, a pixel detected with a greater or smaller phase difference (or with a smaller or greater coherence) may be an accurately detected pixel that is employed as a pixel that constitutes an optical distribution image finished with synthesis.

Figure 6A:
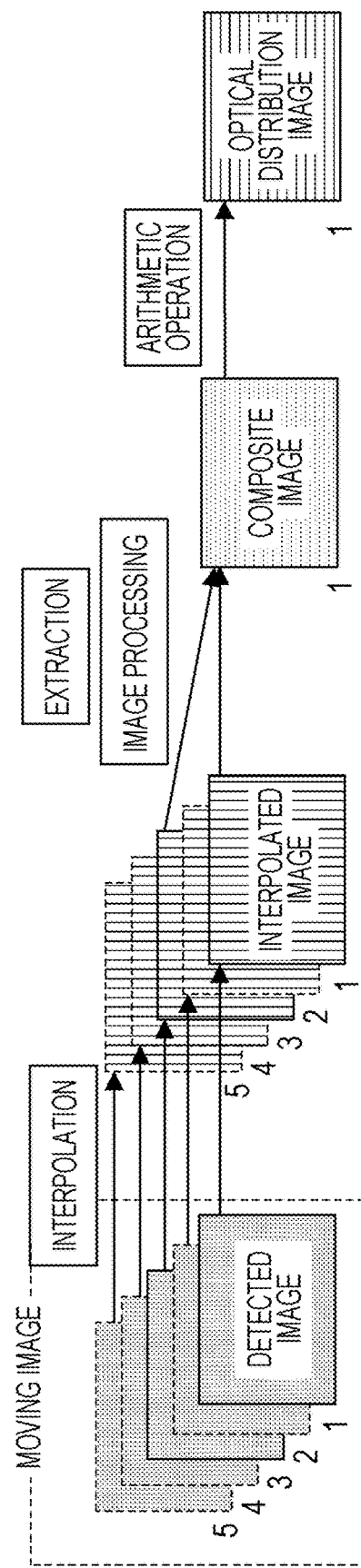
FIG. 6A shows the frame-by-frame flow of images from the acquisition of a moving image to the generation of an optical distribution image according to the embodiment shown in FIG. 5A.

FIG. 6A shows the frame-by-frame flow of images from the acquisition of a moving image to the generation of an optical distribution image according to the embodiment shown in FIG. 5A. The step of generating one frame of interpolated image by using one frame of detected image is the same as that of the example of discussion. A composite image is obtained by extracting two frames (or more) of interpolated image from among a plurality of frames of interpolated image. One frame of optical distribution image is generated by arithmetic processing of one frame of composite image.

Figure 6B:
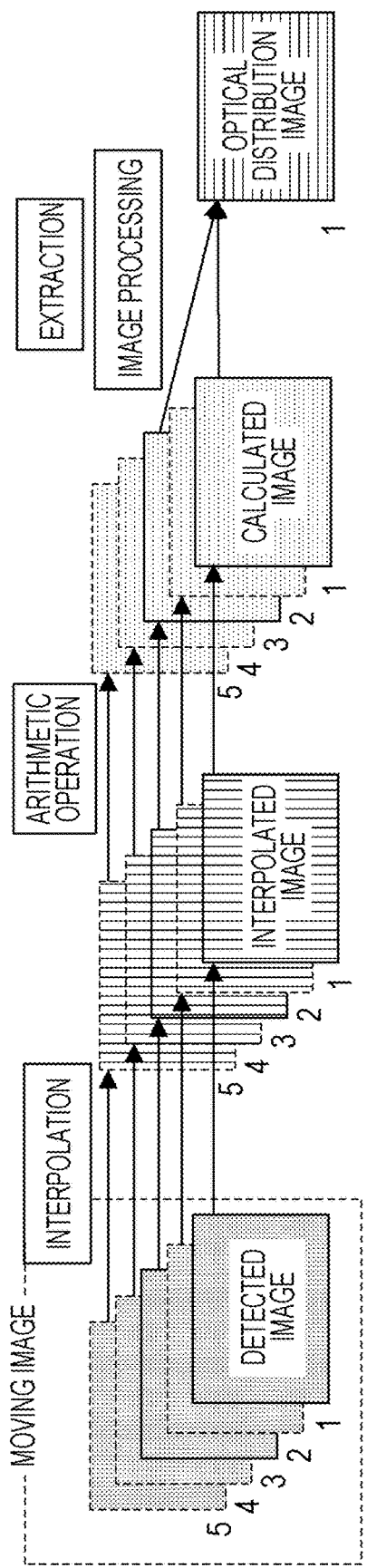
FIG. 6B shows the frame-by-frame flow of images from the acquisition of a moving image to the generation of an optical distribution image according to the embodiment shown in FIG. 5E.

FIG. 6B shows the frame-by-frame flow of images from the acquisition of a moving image to the generation of an optical distribution image according to the modification of the first embodiment shown in FIG. 5E. The step of generating one frame of interpolated image by using one frame of detected image and generating one frame of arithmetic image (detected image finished with arithmetic) from one frame of interpolated image is the same as that of the example of discussion. In the example of discussion, an arithmetic image represents an optical distribution image. One frame of optical distribution image is generated by extracting two frames (or more) of arithmetic image from among a plurality of frames of arithmetic image and combining the two frames (or more) of arithmetic image. In this embodiment, a composite image represents an optical distribution image.

Example

The following describes an example carried out to confirm the effects of an embodiment of the present disclosure.

FIG. 7 is a schematic view showing a configuration of an imaging apparatus used in the present example. Elements in stages following the image sensor 13 are the same as those of the modification of the first embodiment shown in FIG. 5E. In the present example, a phase difference sample 25 was an object, and light transmitted by the phase difference sample 25 was detected.

A laser diode with a wavelength of 850 nm was used as the light source 2 to emit parallel light through a collimator lens (not illustrated). The phase difference sample 25 is a stepped quartz glass with a thickness of 1 mm, and the height of the step is 700 nm. The step is formed in a linear fashion parallel to the Y direction (i.e. a direction from the near side to the far side of the surface of paper). Irradiation of this step with parallel light causes light transmitted by the phase difference sample 25 to turn into light having a sharp phase difference at the step.

A telecentric lens with a magnification of ×1 was used as the lens optical system 7 to form an image of the phase difference sample 25 on the image sensor 13. The direction of the grating vector of each of the gratings 12d of the image sensor 13 is the X direction. That is, the waveguide direction of light having entered the optically-coupled layer 12 is the X direction.

An actuator 21 was provided to move the object. A fine alignment stage that can move in the X direction was used as the actuator 21. The fine alignment stage and the phase difference sample 25 are firmly fixed to the image sensor 13 so that the image sensor 13 moves as the stage moves.

The image sensor 13 is configured as shown in FIGS. 2A and 2B. As with the configuration shown in the analysis described with reference to FIG. 4A, the width W of the optically-coupled layer 12 in the X direction was 5.6 µm, the depth of each of the gratings 12d in the Z direction was 0.2 µm, each of the second transparent layers 12b was a $Ta_2O_5$ film, the thickness $t_1$ of each of the second transparent layers 12b in the Z direction was 0.34 µm, each of the first transparent layers 12c was a $SiO_2$ film, and where the thickness $t_2$ of each of the first transparent layers 12c in the Z direction was 0.22 µm.

The phase difference sample 25 was set in a predetermined initial position, and the moving image acquirer 14 acquired a first frame of detected image from the first pixel group and the second pixel group. The range of acquisition is a range of 16×16 pixels including an image of the step.

The interpolation processor 15 performed interpolation processing on the image from each of the pixel groups. A method for interpolation of a missing pixel is the same as that described in the example of discussion. That is, the values of the amounts of light of the adjacent actual pixels on both sides in the X direction were averaged.

The arithmetic operator 16 performed arithmetic processing with images from both pixel groups thus interpolated. In the arithmetic processing, a detected value was calculated for each pixel according to the aforementioned formula P1/(P1+P0). Then, a detected value corresponding to the phase difference was outputted as a luminance value of an optical distribution image. The luminance value was set to become lower as the phase difference becomes greater when the image was displayed.

Figure 8A:
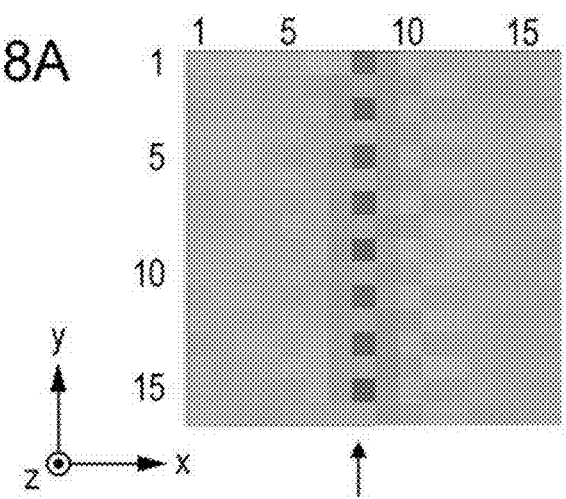
FIG. 8A shows a first frame of arithmetic image outputted from an arithmetic operator.

FIG. 8A shows a first frame of arithmetic image outputted from the arithmetic operator 16. The image of the step of the phase difference sample 25 appears in the eighth column (as indicated by an upward arrow). On either side of this column, light with a different phase is shown to be incident on the image sensor 13. Pixels with low luminance values are observed only in the eighth column. This shows that the phase of the incident light changes abruptly (within the range of width of substantially one pixel) at the eighth column.

Looking at the eighth column in FIG. 8A shows that the pixels in the even-numbered rows have high luminance values, i.e. are detected with small phase differences, although the boundary at which the phase of incident light changes extends continuously in the Y direction. A cause of this was retraced back to a pre-arithmetic image. As a result, it was found that, in this example, interpolation errors in missing pixels of the second pixel group were largely reflected in the arithmetic result. The pixels in the eighth column and in the even-numbered rows are missing pixels of the second pixel group. Given these circumstances, the values of the amounts of light of these missing pixels were calculated by averaging the values of the amounts of light of adjacent pixels on both sides (i.e. the pixels in the seventh and ninth columns), which are regions with small phase differences. That was a cause of the errors in the image finished with arithmetic.

Next, the fine alignment stage, i.e. the actuator 21, was moved to move the phase difference sample 25 leftward in the X direction by the width (5.6 μm) of one pixel of the image sensor 13. This is equivalent to changing the position of the image of the phase difference sample 25 on the image sensor 13. In this state, a second frame of detected image was acquired from the first pixel group and the second pixel group and subjected to the same interpolation processing and arithmetic processing as the first frame.

Figure 8B:
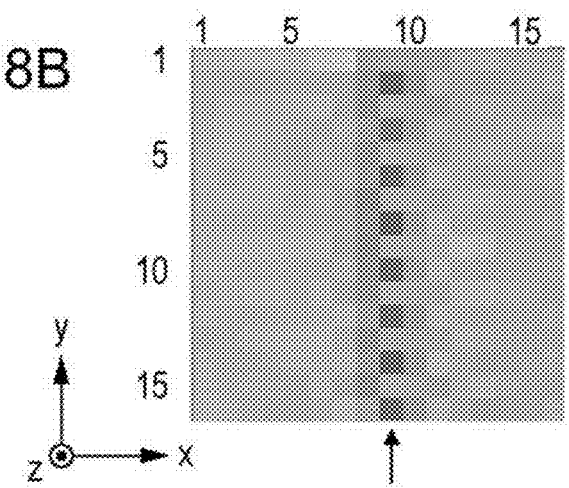
FIG. 8B shows a second frame of arithmetic image outputted from the arithmetic operator.

FIG. 8B shows a second frame of arithmetic image outputted from the arithmetic operator 16. Since the phase difference sample 25 was moved rightward by one pixel, the image of the step appears in the ninth column (as indicated by an upward arrow). The second frame of arithmetic image differs from the first frame of arithmetic image in that the pixels in the ninth column and in the odd-numbered rows have high luminance values, i.e. are detected with small phase differences. In the present example, a light-shielding region group is present in the form of such a checkered pattern as that shown in FIG. 2B. Therefore, as with the even-numbered rows in the eighth column, the odd-numbered rows in the ninth column are equivalent to missing pixels of the second pixel group. As in the case of the first frame of image finished with arithmetic, it was found that, in the second frame, too, interpolation errors in missing pixels of the second pixel group were largely reflected in the arithmetic result.

Furthermore, in the same manner, third to fifth frames of arithmetic image were acquired by moving the fine alignment stage arbitrary distances.

Figure 8C:
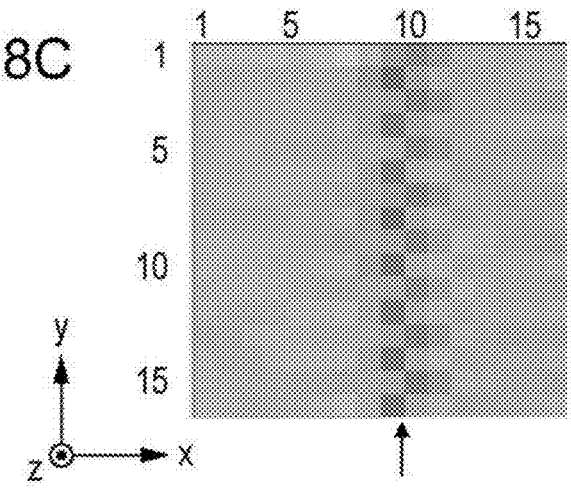
FIG. 8C shows a third frame of arithmetic image outputted from the arithmetic operator.

FIG. 8C shows a third frame of arithmetic image outputted from the arithmetic operator 16. Since pixels with slightly lower luminance values appear in the ninth and tenth columns, it is considered that the image of the step is present between the ninth column and the tenth column (as indicated by an upward arrow).

Figure 8D:
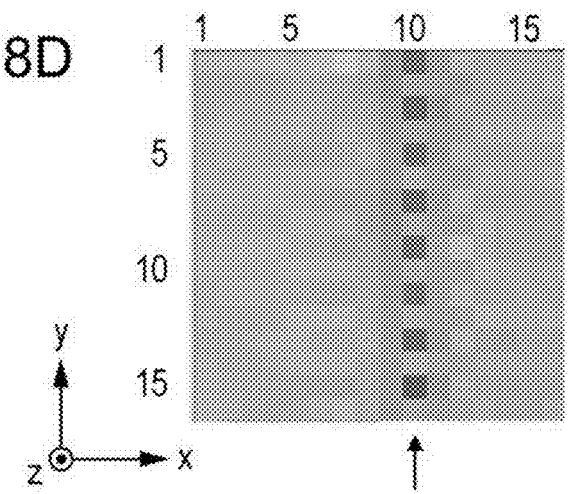
FIG. 8D shows a fourth frame of arithmetic image outputted from the arithmetic operator.
Figure 8E:
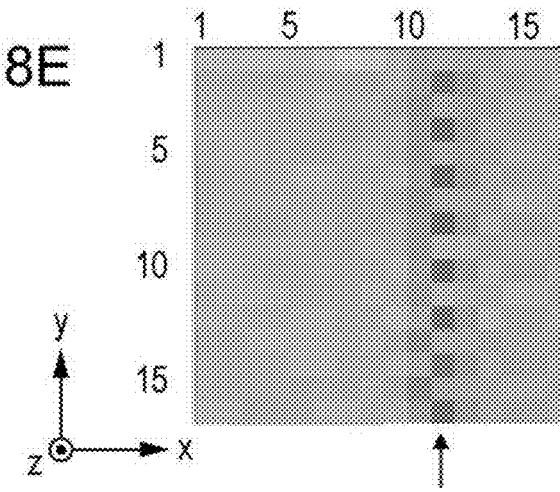
FIG. 8E shows a fifth frame of arithmetic image outputted from the arithmetic operator.

FIG. 8D shows a fourth frame of arithmetic image outputted from the arithmetic operator 16. FIG. 8E shows a fifth frame of arithmetic image outputted from the arithmetic operator 16. As can be inferred from pixels with lower luminance values, it is considered that the image of the step is present in the tenth column in the fourth frame (as indicated by an upward arrow) and in the eleventh column in the fifth frame (as indicated by an upward arrow).

Two arithmetic images for use in synthesis are extracted from among the arithmetic images (i.e. the detected images finished with arithmetic) shown in FIGS. 8A to 8E. The images to be extracted may be selected so that there is a high probability that pixels in which interpolation errors occur in the two frame (or pixels whose amounts of light can be accurately detected) are complementary to each other.

In the present example, the light-transmitting regions 9a and the light-shielding regions 9A are arranged in a checkered pattern. That is, the light-transmitting regions 9a and the light-shielding regions 9A are alternately arranged with respect to the waveguide direction (i.e. the X direction) of light in the optically-coupled layer 12. Therefore, selecting two frames of arithmetic images differing from each other in the amount of movement of the image of the object by a substantially odd multiple of the width W of one pixel makes it easy to generate an accurate optical distribution image from the two frames of arithmetic image.

The five frames of arithmetic image of the present example include a plurality of combinations of two frames of arithmetic image differing from each other in the amount of movement of the image of the step by a substantially odd multiple of the width W of one pixel. The first frame (FIG. 8A) of arithmetic image and the second frame (FIG. 8B) of arithmetic image are extracted here. In addition to the first and second frames, another frame of arithmetic image may be extracted for use in synthesis.

It should be noted that it is not essential to select and extract arithmetic images differing from each other in the amount of movement of the image of the step by a substantially odd multiple of the width W of one pixel. This is because the probability of inclusion of arithmetic images that are in such a desired state becomes higher as the number of arithmetic images extracted increases, even in a case where arithmetic images are randomly selected and extracted.

An example of a step of generating an optical distribution image from the first and second frames of arithmetic image by using the image processing circuit 22 is described here.

The image position calculator 23 determined the amount of displacement of the first and second frames of image. In the present example, it is known that the telecentric lens had a magnification of ×1 and the phase difference sample 25 was moved rightward by one pixel of the image sensor 13. This shows that the displacement between the first and second frames of image is one pixel in the X direction.

It should be noted that even in a case where the amount of movement of the phase difference sample 25 is unknown, it can be estimated from pixels with lower luminance values (which are equivalent to the features of an arithmetic image) that the displacement between the first and second frames of image is one pixel in the X direction.

The image synthesizer 24 shifted the first frame of image rightward by one pixel and combined it with the second frame of image. A method for synthesis was used here in which a pixel detected with a greater phase difference is employed as an accurately-detected pixel.

Figure 8F:
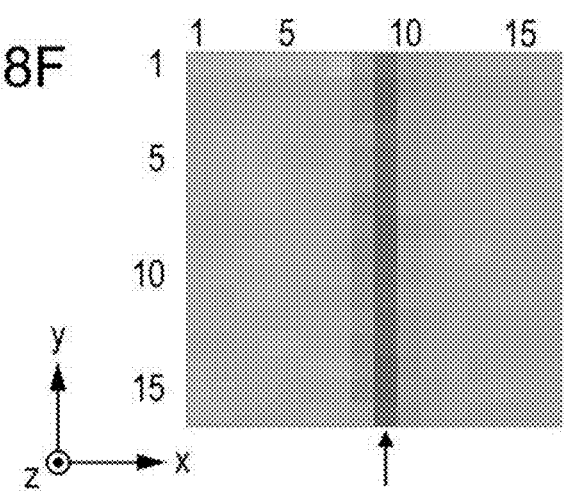
FIG. 8F shows an output image from an image synthesizer.

FIG. 8F shows an output image (i.e. an optical distribution image) from the image synthesizer 24. This image is displayed with continuously low luminance in the ninth column (as indicated by an upward direction in FIG. 8F) in which the image of the step is present. In other words, in an optical distribution image of the present example, a state where the boundary at which the phase of incident light changes extends continuously in the Y direction is accurately detected.

As described above, each of the imaging apparatuses 120 and 140 according to the first embodiment is configured to acquire, from the first pixel group and/or the second pixel group, a moving image including two frames of detected image differing in position of an image of an object in the waveguide direction of the optically-coupled layer 12. Therefore, even in a case where a detected amount of light cannot be accurately determined in a missing pixel, a degree of phase difference or coherence can be precisely measured as an optical distribution image.

In an actual imaging environment, the direction or amount of movement of the object is random. Therefore, the image of the object does not necessarily move a substantially odd multiple of W in the X direction in two frames. Nevertheless, increasing the number of frames of detected image to be acquired increases the probability of acquiring two frames of detected image differing in position of the image of the object by a substantially odd multiple of W in the X direction. The aforementioned effect can be brought about by extracting an image including such two frames from interpolated and calculated pixel groups.

If the direction of movement of the object is random (or an unpredictable direction), it is practically conceivable that the image of the object moves with a component including the X direction. The image of the object moves without a component including the X direction only in a case where the image of the object moves in a direction that completely coincides with the Y direction. This is because the probability of the image of the object moving in a direction that completely coincides with the Y direction is far lower than the probability of the image of the object moving in a direction that does not coincide with the Y direction.

In an actual imaging environment, there may be a situation where the object is substantially static. Even in such a situation, the object and the imaging apparatus may each slightly move (e.g. in the order of micrometers or more) under the influence of vibration and/or airflow of the place where they are installed. Therefore, the aforementioned effect can be brought about even in a situation where the object is substantially static, excluding a special situation where the object and the imaging apparatus are installed on a precision vibration isolation table.

Second Embodiment

A description of a second embodiment mainly details elements that are different from those of the first embodiment. Elements that are the same as those of the first embodiment are given the same reference numerals.

Figure 9:
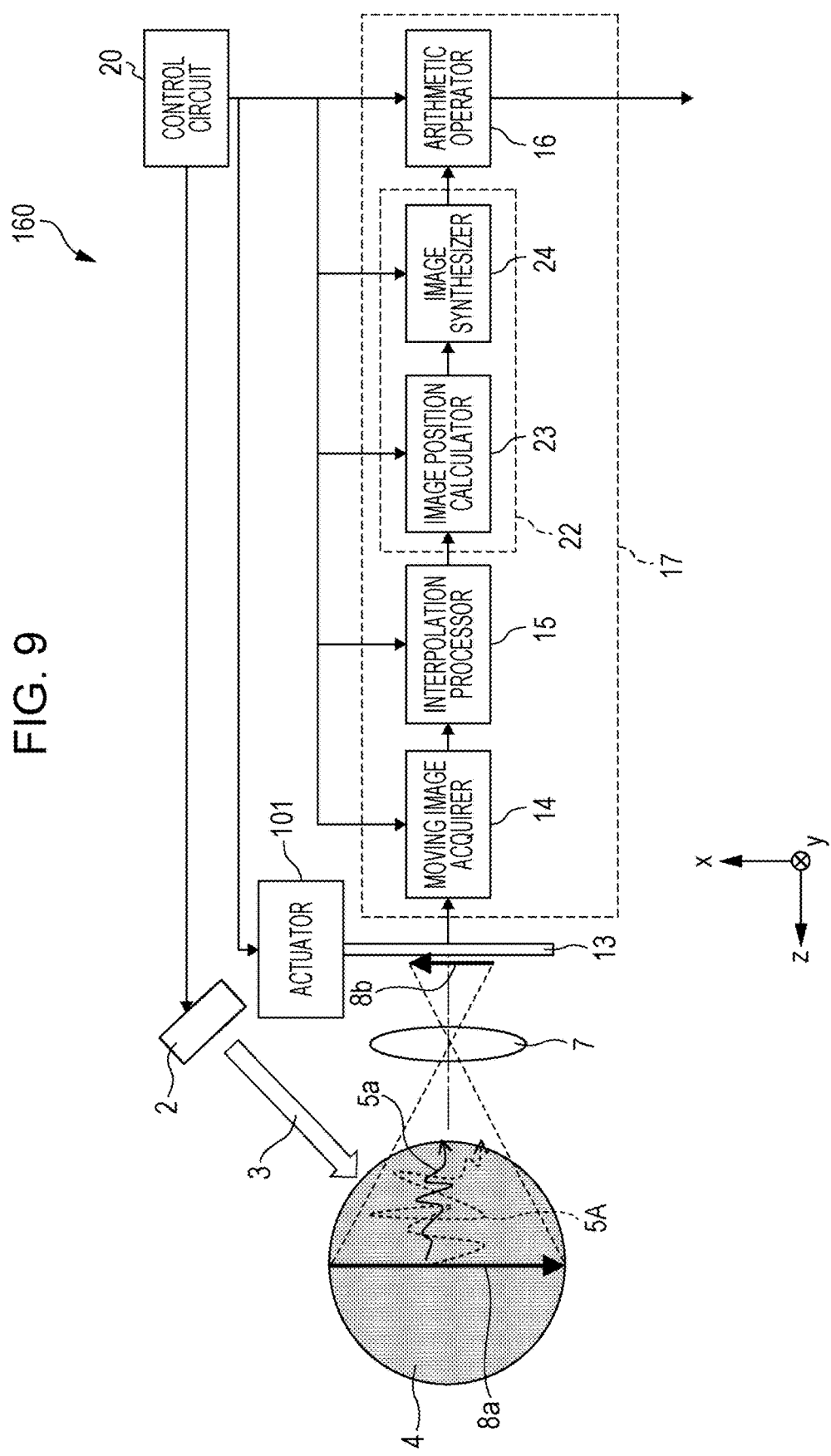
FIG. 9 is a schematic view of an imaging apparatus according to a second embodiment.

FIG. 9 is a schematic view of an imaging apparatus 160 according to the second embodiment. The imaging apparatus 160 includes an actuator 101 in addition to the elements described in the first embodiment. The operation of the actuator 101 is controlled by the control circuit 20.

The actuator 101 may be realized, for example, by a piezoelectric element or a linear actuator. In a case where the actuator 101 is realized, for example, by a linear actuator, the actuator 101 may include an electric motor, a rack, and a pinion. An element that converts voltage into power, such as a piezoelectric element, is herein encompassed in the concept of "actuator". The actuator 101 is mechanically connected to the image sensor 13. The actuator 101 causes the image sensor 13 to slightly change its position in a plane orthogonal to the optical axis (indicated by an alternate long and short dashed line in FIG. 9) of the optical system 7. The direction of movement of the image sensor 13 is the direction (i.e. the X direction) in which light having entered the optically-coupled layer 12 is guided.

More accurate interpolations can be performed if the distance of movement of the image sensor 13 is such a distance that the image 8b of the object 4 that is formed on the imaging area of the image sensor 13 changes its position by W or longer in the X direction. The distance of movement of the image sensor 13 may be a substantially odd multiple of W.

By causing the image sensor 13 to change its position along a plane orthogonal to the optical axis, a relative positional relationship between the image 8b formed on the image sensor 13 and the image sensor 13 is changed, even if the object 4 and the imaging apparatus 160 are substantially static. The image 8b is an image formed by condensing scattering light from the object 4. This change in positional relationship is herein called "change in optical positional relationship between the object and the image sensor". That is, the movement of the image sensor 13 brings the optical positional relationship between the object 4 and the image sensor 13 into a different state. It should be noted that the direction of movement of the image sensor 13 may be a direction inclined from the X direction on the XY plane. In that case, too, the effect of the second embodiment can be brought about, as the relative positional relationship between the image sensor 13 and the image 8b of the object 4 changes in the X direction.

The image position calculator 23 determines the direction and magnitude of displacement of the image 8b between two or more detected images differing in optical positional relationship. In a case where the object 4 has moved during the acquisition of the moving image, the displacement may be calculated by comparing similar parts of the plurality of detected images, and in a case where the object 4 and the imaging apparatus 160 are substantially static, the displacement may be calculated from the amount of movement of the image sensor 13.

The image synthesizer 24 aligns the two or more interpolated images differing in optical positional relationship so that the displacement is eliminated, combines the interpolated images into one composite image, and outputs the composite image.

Operation

The following describes the operation of the second embodiment.

The control circuit 20 controls the moving image acquirer 14 and the interpolation processor 15 to acquire a moving image from the image sensor 13. The control circuit 20 performs interpolation processing on each frame of detected image that constitutes the moving image. Each interpolated image (detected image finished with interpolation) is sent to the image processing circuit 22 and stored in a memory (not illustrated) provided in the image processing circuit 22.

At this point in time, between the timing of acquisition of one frame and the timing of acquisition of the next frame, the control circuit 20 controls the actuator 101 to move the image sensor 13. This results in a change in optical positional relationship between the object 4 and the image sensor 13.

The amount of movement of the image sensor 13 between frames may for example be W in the X direction (i.e. the waveguide direction of the optically-coupled layer 12). The image sensor 13 may reciprocate at every timing of frame acquisition. The image sensor 13 may linearly move over the duration of acquisition of a plurality of frames.

The amount of movement of the image sensor 13 may be controlled according to the amount or direction of movement of the object 4. For example, the actuator 101 stops the movement of the image sensor 13, and then the image sensor 13 acquires a moving image composed of a plurality of frames of detected image. By the image position calculator 23 calculating a positional displacement between detected images, the amount and direction of movement of the object 4 can be estimated. In a case where the movement of the object 4 has caused the image 8b of the object 4 to move a substantially odd multiple of W in the X direction, the actuator 101 keeps the image sensor 13 static. In a case where the image 8b of the object 4 has moved a substantially even multiple of W in the X direction, a case where the image 8b of the object 4 has moved in the Y direction, or a case where the image 8b of the object 4 is substantially static, the actuator 101 moves the image sensor 13 a substantially odd multiple of W in the X direction. Such an operation makes it possible to avoid an unnecessary movement of the image sensor 13. This in turn allows the imaging apparatus 160 to consume less power.

The control circuit 20 controls the image position calculator 23 and the image synthesizer 24 to extract two frames (or more) of interpolated image from among all of the frames of interpolated image stored in the memory. After that, the control circuit 20 aligns these interpolated images. This allows the control circuit 20 to obtain one composite image.

With such an embodiment, at least two frames of detected image differing in optical positional relationship in the waveguide direction of the optically-coupled layer 12 both in a case where the object 4 and the imaging apparatus 160 are substantially static during the acquisition of the moving image and a case where the direction of movement of the image 8b of the object 4 is a direction (i.e. the Y direction) orthogonal to the waveguide direction of the optically-coupled layer 12. Therefore, a degree of phase difference or coherence can be precisely measured as an optical distribution image.

Although, in the second embodiment, the actuator 101 changes the position of the image sensor 13, the present disclosure is not limited to such a configuration. The present disclosure needs only be configured such that two image signals with a shift in position of the object 4 in the image in a direction corresponding to the waveguide direction of light in the optically-coupled layer 12 can be acquired. The following describes other example configurations.

Figure 10A:
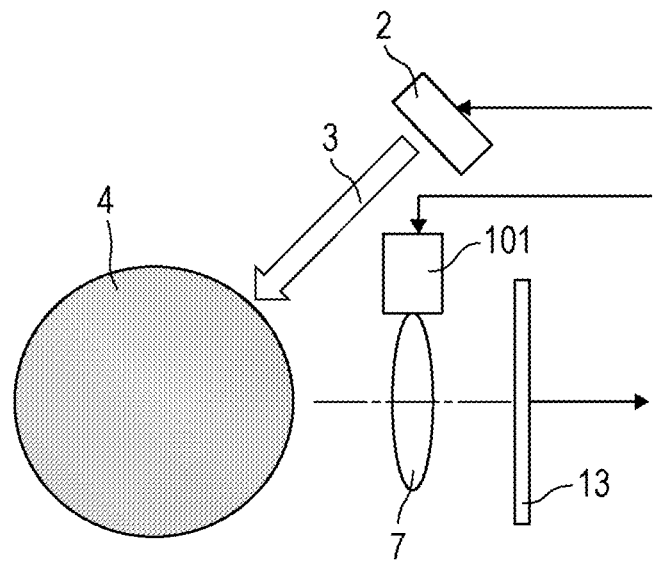
FIG. 10A shows an example configuration in which an actuator moves a lens optical system in a plane orthogonal to an optical axis.

FIG. 10A shows an example configuration in which the actuator 101 moves the lens optical system 7 in a plane orthogonal to an optical axis (indicated by an alternate long and short dashed line). Even with such a configuration, the position of an image on the image sensor 13 can be changed along with the movement of the lens optical system 7. Therefore, the optical positional relationship between the object 4 and the image sensor 13 can be changed. The actuator 101 may move an image by moving a part of lenses constituting the optical system 7 instead of moving the whole optical system 7.

Figure 10B:
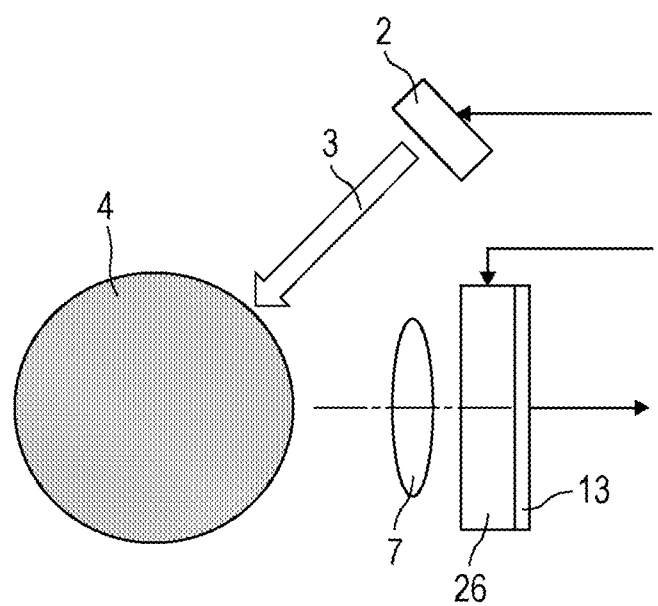
FIG. 10B shows an example configuration in which an optical path adjuster is disposed in place of the actuator between an object and an image sensor.

FIG. 10B shows an example configuration in which an optical path adjuster 26 is disposed in place of the actuator 101 between the object 4 and the image sensor 13. As in this example, the present disclosure may be configured such that the direction of a ray of light is uniformly changed by driving the optical path adjuster 26. Even with such a configuration, the position of an image on the image sensor 13 can be changed in the waveguide direction of the optically-coupled layer 12 along with a change in direction of a ray of light. Therefore, the optical positional relationship between the object 4 and the image sensor 13 can be changed. A change in position of an image on the image sensor 13 may be such that the image is displaced by an odd multiple of W in the waveguide direction of the optically-coupled layer 12. A usable example of the optical path adjuster 26 is an optical element that can change a refractive index through electric drive from an outside source, such as an acousto-optic element or an electro-optic modulation element.

The second embodiment has shown a configuration in which two frames of image differing in optical positional relationship are acquired at different timings by using one image sensor 13. However, such a configuration is also possible that two frames of image differing in optical positional relationship can be acquired at the same timing.

Figure 11:
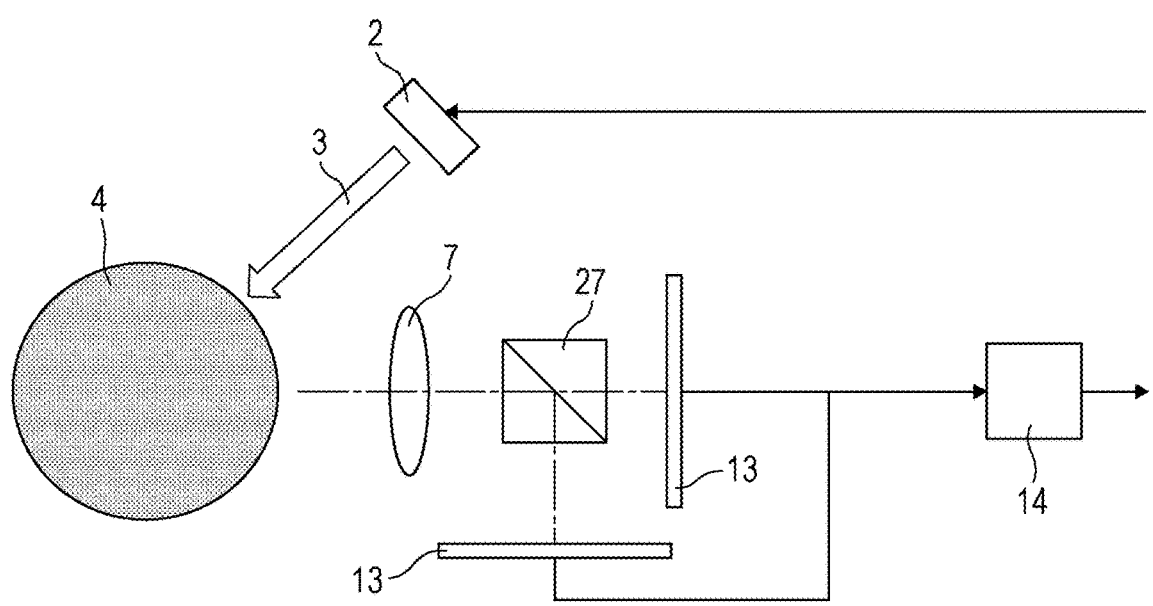
FIG. 11 shows an example configuration in which a semitransparent mirror is disposed between an object and two image sensors.

FIG. 11 shows an example configuration in which a semitransparent mirror 27 is disposed between an object 4 and two image sensors 13. The configuration shown in FIG. 11 differs from the aforementioned embodiments in that light from the object 4 is split by the semitransparent mirror 27 to enter the two image sensors 13. The semitransparent mirror 27 may be replaced by a beam splitter. In the example shown in FIG. 11, the "optical system" includes the semitransparent mirror 27 in addition to the lens optical system 7. The two image sensors 13 and the semitransparent mirror 27 are disposed so that a ray of light from one point on the object 4 enters one of the light-transmitting regions 9a in a first one of the two image sensors 13 and enters one of the light-shielding regions 9A in a second one of the two image sensors 13. For example, let it be assumed that the waveguide direction of the optically-coupled layer 12 is the X direction for each of the two image sensors 13 having the same structure. Then, the constituent elements may be disposed so that images of the object 4 that are formed on the respective imaging areas of the image sensors 13 are displaced from each other by an odd multiple of W in the X direction in a comparison in a state where the pixels are aligned. Such a configuration makes it possible to apply the aforementioned signal processing without change.

The first frame of detected image is acquired from the first one of the two image sensors 13. The second frame of detected image is acquired from the second one of the two image sensors 13. Use of such a configuration makes it possible to acquire the detected images at the same time with no time constraints on the acquisition of the two frames of detected image. The two image sensors 13 do not need to have the same structure and, for example, may have different numbers of pixels. Even in a case where the two image sensors 13 have different numbers of pixels, a process which is the same as the aforementioned synthesis process can be applied by signal processing.

As described above, the present disclosure encompasses an imaging apparatus according to any of the following items.

Item 1
An imaging apparatus according to Item 1 of the present disclosure includes:
an image sensor for acquiring a moving image of an object, the image sensor including:
a light-shielding film including light-transmitting regions and light-shielding regions, the light-transmitting regions and the light-shielding regions being alternately arranged in at least a first direction within a plane;
a photodetector disposed opposite the light-shielding film, the photodetector having an imaging area, the photodetector including first pixels and second pixels, the first pixels and the second pixels being two-dimensionally arranged on the imaging area, each of the first pixels facing one of the light-transmitting regions, each of the second pixels facing one of the light-shielding regions; and
an optically-coupled layer disposed between the light-shielding film and the photodetector, the optically-coupled layer including a grating which generates a propagating light that propagates in the first direction and a transmitting light that transmits the optically-coupled layer when light of a predetermined wavelength enters the light-transmitting regions;
an optical system that forms an image of the object on the imaging area;
a control circuit that causes the image sensor to acquire the moving image; and
a signal processing circuit that extracts two different frames from among frames included in the moving image acquired by the image sensor.
Item 2
In the imaging apparatus according to Item 1, each of the light-transmitting regions and each of the light-shielding regions may be of equal width in the first direction, and
the signal processing circuit may extract, from among the plurality of frames, two different frames differing in position of the image of the object by an odd multiple of the width in the first direction.
Item 3
In the imaging apparatus according to Item 1 or 2, the light-transmitting regions and the light-shielding regions may be further alternately arranged in a second direction that is orthogonal to the first direction.
Item 4
The imaging apparatus according to any of Items 1 to 3 may further include an actuator controlled by the control circuit to change, in the first direction, a position of one of the image sensor and the optical system,
wherein the control circuit may further determine, on the basis of the moving image, whether the object is static, and
when having determined that the object is static, the control circuit may
cause the image sensor to acquire a first image of the object when the position of the one of the image sensor and the optical system is a first position,
cause the actuator to change the position of the one of the image sensor and the optical system to a second position that is different from the first position, and
cause the image sensor to acquire a second image of the object.
Item 5
The imaging apparatus according to any of Items 1 to 3 may further include an optical path adjuster disposed between the image sensor and the object and controlled by the control circuit to change a position of the image on the imaging area in the first direction by changing a path of light from the object toward the image sensor in the first direction,
wherein the control circuit may further determine, on the basis of the moving image, whether the object is static, and
when having determined that the object is static, the control circuit may
cause the image sensor to acquire a first image of the object when the position of the image on the imaging area is a first position,
cause the optical path adjuster to change the position of the image on the imaging area to a second position that is different from the first position, and
cause the image sensor to acquire a second image of the object.
Item 6
In the imaging apparatus according to any of Items 1 to 5, the signal processing circuit may further generate one frame by combining the two frames.
Item 7
In the imaging apparatus according to any of Items 1 to 6, the optically-coupled layer may include
a first low-refractive-index layer,
a high-refractive-index layer disposed on the first low-refractive-index layer and including the grating, and
a second low-refractive-index layer disposed on the high-refractive-index layer, and
the high-refractive-index layer may have a higher refractive index than the first low-refractive-index layer and the second low-refractive-index layer.

In the present disclosure, all or a part of any of circuit, unit, device, part or portion, or any of functional blocks in the block diagrams may be implemented as one or more of electronic circuits including, but not limited to, a semiconductor device, a semiconductor integrated circuit (IC) or an LSI. The LSI or IC can be integrated into one chip, or also can be a combination of plural chips. For example, functional blocks other than a memory may be integrated into one chip. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

What is claimed is:
1. An imaging apparatus comprising:
an image sensor for acquiring a moving image of an object, the image sensor including:
a light-shielding film including light-transmitting regions and light-shielding regions, the light-transmitting regions and the light-shielding regions being alternately arranged in at least a first direction within a plane;

a photodetector disposed opposite the light-shielding film, the photodetector having an imaging area, the photodetector including first pixels and second pixels, the first pixels and the second pixels being two-dimensionally arranged on the imaging area, each of the first pixels facing one of the light-transmitting regions, each of the second pixels facing one of the light-shielding regions; and an optically-coupled layer disposed between the light-shielding film and the photodetector, the optically-coupled layer including a grating which generates a propagating light that propagates in the first direction and a transmitting light that transmits through the optically-coupled layer when light of a predetermined wavelength enters the light-transmitting regions;

an optical system that forms an image of the object on the imaging area;

a control circuit that causes the image sensor to acquire the moving image; and a signal processing circuit that extracts two different frames from among frames included in the moving image acquired by the image sensor.

2. The imaging apparatus according to claim 1, wherein each of the light-transmitting regions and each of the light-shielding regions are of equal width in the first direction, and the signal processing circuit extracts, from among the frames, two different frames differing in position of the image of the object by an odd multiple of the width in the first direction.

3. The imaging apparatus according to claim 1, wherein the light-transmitting regions and the light-shielding regions are further alternately arranged in a second direction that is orthogonal to the first direction.

4. The imaging apparatus according to claim 1, further comprising an actuator controlled by the control circuit to change, in the first direction, a position of one of the image sensor and the optical system, wherein the control circuit further determines, on the basis of the moving image, whether the object is static, and when having determined that the object is static, the control circuit causes the image sensor to acquire a first image of the object when the position of the one of the image sensor and the optical system is a first position, causes the actuator to change the position of the one of the image sensor and the optical system to a second position that is different from the first position, and causes the image sensor to acquire a second image of the object.

5. The imaging apparatus according to claim 1, further comprising an optical path adjuster disposed between the image sensor and the object and controlled by the control circuit to change a position of the image on the imaging area in the first direction by changing a path of light from the object toward the image sensor in the first direction, wherein the control circuit further determines, on the basis of the moving image, whether the object is static, and when having determined that the object is static, the control circuit causes the image sensor to acquire a first image of the object when the position of the image on the imaging area is a first position, causes the optical path adjuster to change the position of the image on the imaging area to a second position that is different from the first position, and causes the image sensor to acquire a second image of the object.

6. The imaging apparatus according to claim 1, wherein the signal processing circuit further generates one frame by combining the two different frames.

7. The imaging apparatus according to claim 1, wherein the optically-coupled layer includes a first low-refractive-index layer, a high-refractive-index layer disposed on the first low-refractive-index layer and including the grating, and a second low-refractive-index layer disposed on the high-refractive-index layer, and the high-refractive-index layer has a higher refractive index than the first low-refractive-index layer and the second low-refractive-index layer.

* * * * *